US009927987B2

(12) United States Patent
Yang et al.

(10) Patent No.: US 9,927,987 B2
(45) Date of Patent: Mar. 27, 2018

(54) ADAPTIVE MULTI-PHASE ERASE

(71) Applicant: SanDisk Technologies Inc., Plano, TX (US)

(72) Inventors: Nian Niles Yang, Mountain View, CA (US); Alexandra Bauche, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 97 days.

(21) Appl. No.: 14/929,179

(22) Filed: Oct. 30, 2015

(65) Prior Publication Data
US 2017/0060445 A1 Mar. 2, 2017

Related U.S. Application Data

(60) Provisional application No. 62/211,201, filed on Aug. 28, 2015.

(51) Int. Cl.
*G06F 13/10* (2006.01)
*G06F 3/06* (2006.01)
(Continued)

(52) U.S. Cl.
CPC .......... *G06F 3/0616* (2013.01); *G06F 3/0652* (2013.01); *G06F 3/0653* (2013.01);
(Continued)

(58) Field of Classification Search
CPC ...... G06F 3/0616; G06F 3/0679; G11C 17/18
(Continued)

(56) References Cited

U.S. PATENT DOCUMENTS 9,142,315 B2  9/2015  Mu et al.
9,343,172 B2  5/2016  Mu et al.
(Continued)

FOREIGN PATENT DOCUMENTS

WO  WO 2015/077625  5/2015

OTHER PUBLICATIONS

International Search Report and Written Opinion dated Sep. 20, 2016, received in International Application No. PCT/US2016/036717, which corresponds to U.S. Appl. No. 14/929,179, 13 pages (Yang).

*Primary Examiner* — Jae Yu
(74) *Attorney, Agent, or Firm* — Morgan, Lewis & Bockius LLP

(57) ABSTRACT

The various implementations described herein include systems, methods and/or devices used to enable multi-phase erasure in a storage device. The method includes performing an erase operation on a portion of one or more non-volatile memory devices, by performing a sequence of erase phase operations until an erase operation stop condition is satisfied. Each erase phase operation includes: performing an erase phase on the portion of the non-volatile memory devices using an erase voltage, and determining an erase phase statistic for the erase phase. For each erase phase operation in the sequence of erase phase operations, other than a first erase phase operation, the erase voltage used when performing the erase phase operation is equal to the erase voltage used when performing a prior erase phase operation in the sequence of erase phase operations plus an erase voltage increment based on the erase phase statistic for the prior erase phase operation.

21 Claims, 14 Drawing Sheets

(51) Int. Cl.
*G11C 11/56* (2006.01)
*G11C 16/16* (2006.01)
*G11C 16/34* (2006.01)
*G11C 17/18* (2006.01)

(52) U.S. Cl.
CPC ........ *G06F 3/0679* (2013.01); *G11C 11/5635* (2013.01); *G11C 16/16* (2013.01); *G11C 16/349* (2013.01); *G11C 16/3445* (2013.01); *G11C 16/3495* (2013.01); *G11C 17/18* (2013.01)

(58) Field of Classification Search
USPC ........................................ 711/103
See application file for complete search history.

(56) References Cited

U.S. PATENT DOCUMENTS

| | | |
|---|---|---|
| 9,436,594 B2 | 9/2016 | Hars |
| 2007/0189080 A1* | 8/2007 | Liu .................. G11C 16/16 365/185.29 |
| 2010/0023675 A1* | 1/2010 | Chen ................ G06F 12/0246 711/103 |
| 2013/0070527 A1 | 3/2013 | Sabbag et al. |
| 2013/0301353 A1 | 11/2013 | Twitto et al. |

\* cited by examiner

ADAPTIVE MULTI-PHASE ERASE

RELATED APPLICATIONS

This application claims priority to U.S. Provisional Patent Application No. 62/211,201, filed Aug. 28, 2015, which is incorporated by reference in its entirety.

TECHNICAL FIELD

The disclosed embodiments relate generally to memory systems, and in particular, to adaptive multi-phase erasure in a storage device (e.g., comprising one or more flash memory devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Writing data to some types of non-volatile memory, including flash memory requires erasing one or more portions of the memory before writing the data to those portions of the memory. As memory (e.g., flash memory cells) goes through repeated cycles of writes and erasures, it gets worn by the application of repeated, high voltage erase operations. Therefore, it would be desirable to have an erase operation that reduces damage to the one or more portions of the memory.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable adaptive multi-phase erasure in memory devices.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

Figure 1A:
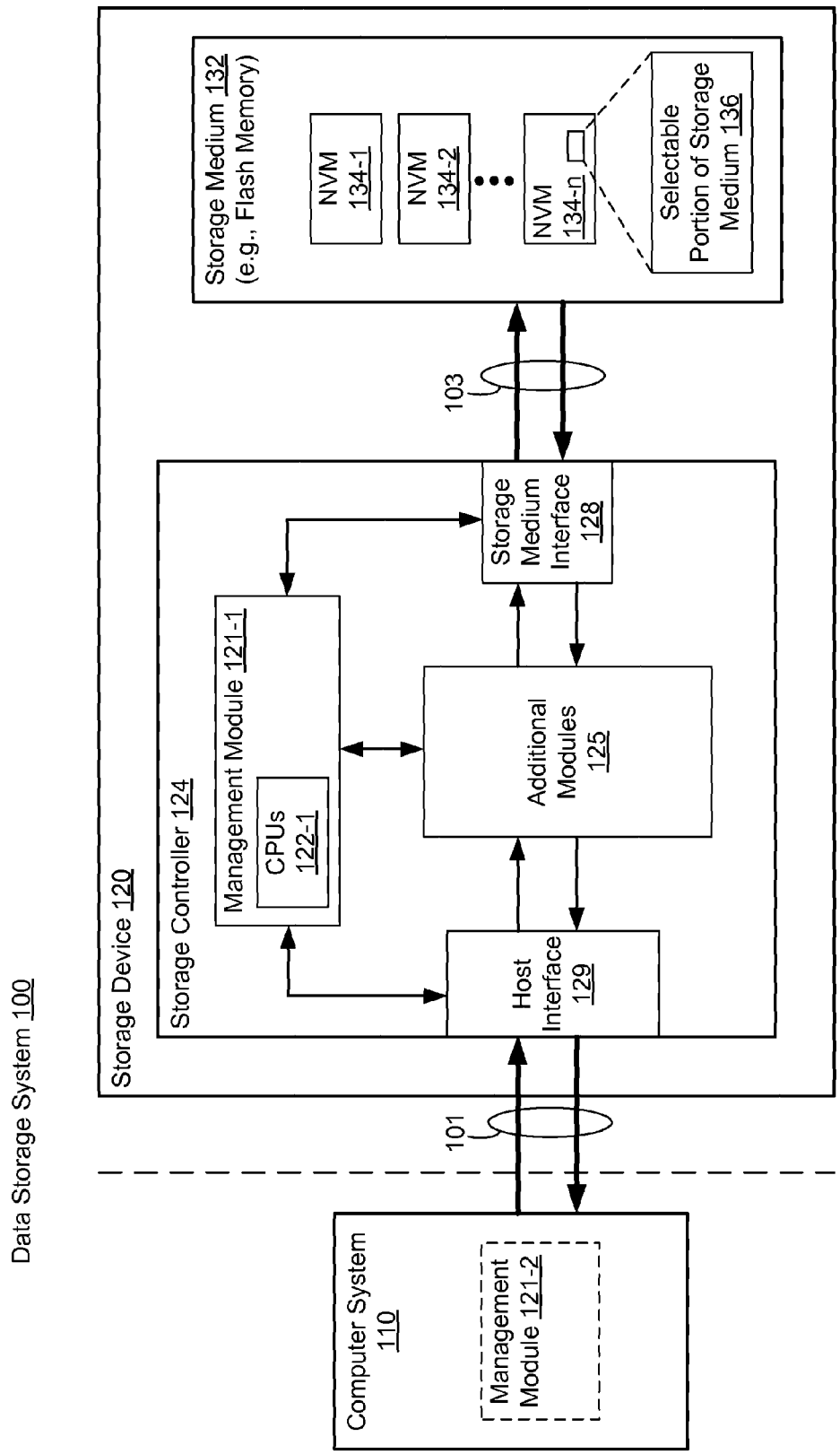
FIG. 1A is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable adaptive multi-phase erasure in memory devices. Some implementations include systems, methods and/or devices to perform a multi-phase erase operation to preserve memory life of a storage device.

(A1) More specifically, some embodiments include a method of erasing data in a storage device having one or more non-volatile memory devices includes performing an erase operation on a portion of the one or more non-volatile memory devices, by performing a sequence of erase phase operations until an erase operation stop condition is satisfied. Each erase phase operation includes: (1) performing an erase phase on the portion of the one or more non-volatile memory devices using an erase voltage, and (2) determining an erase phase statistic for the erase phase. For each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment based on the erase phase statistic for the prior erase phase operation.

(A2) In some embodiments, the method of A1 further includes performing at least one non-erase operation between successive erase phase operations of the erase operation.

(A3) In some embodiments of the method of any of A1-A2, the sequence of erase phase operations includes a first erase phase operation and a last erase phase operation, and the erase voltage used while performing the first erase phase operation is smaller in magnitude than the erase voltage used while performing the last erase phase operation.

(A4) In some embodiments of the method of any of A1-A3, the erase phase statistic for the erase phase corresponds to a count of memory cells in the portion of the one or more non-volatile memory devices having a threshold voltage that satisfies a criterion corresponding to the erase phase.

(A5) In some embodiments of the method of any of A1-A3, the erase phase statistic for the erase phase corresponds to a measurement of success in erasing the portion of the one or more non-volatile memory devices.

(A6) In some embodiments of the method of any of A1-A5, the method further includes, in response to a determination that the erase phase statistic satisfies the erase operation stop condition: stopping the erase operation, and recording erase information associated with the stopped erase operation.

(A7) In some embodiments, the method of A6, the erase information includes a respective memory portion health metric in accordance with an erase difficulty metric for the stopped erase operation and information corresponding to a total number of erase operations performed on the portion of the one or more non-volatile memory devices during a lifespan of the storage device.

(A8) In some embodiments of the method of any of A1-A7, the sequence of erase phase operations includes a last allowable erase phase, and the method further includes, in response to a determination that the last allowable erase phase fails to satisfy the erase operation stop condition, storing an indication that the portion of the one or more non-volatile memory devices is retired.

(A9) In some embodiments of the method of A8, the last allowable erase phase is a heroic erase phase.

(A10) In some embodiments of the method of any of A1-A7, the sequence of erase phase operations is limited to a threshold number of erase phases such that the erase operation is stopped when the threshold number of erase phases are performed on the portion of the one or more non-volatile memory devices.

(B1) In another aspect, a method of erasing data in a storage device using a multi-phase erase operation, where the storage device has one or more non-volatile memory devices. The method includes performing a first phase (also referred to herein as a first erase phase) of the multi-phase erase operation on a portion of the one or more non-volatile memory devices using an erase voltage. Subsequent to performing the first phase of the multi-phase erase operation: the method includes (1) determining a first phase erase statistic for the first phase of the erase operation, (2) determining, in accordance with the first phase erase statistic, an erase voltage increment, (3) increasing the erase voltage by the determined erase voltage increment, and (4) performing a second phase (also referred to herein as a second erase phase) of the multi-phase erase operation on the portion of the one or more non-volatile memory devices using the increased erase voltage. Furthermore, at least one non-erase operation is performed subsequent to the first phase of the multi-phase erase operation and prior to the second phase of the multi-phase erase operation.

(B2) In some embodiments of the method of B1, determining the first phase erase statistic includes determining whether a number of first phase non-erased memory cells satisfies a first phase threshold number of non-erased memory cells. Furthermore, determining the erase voltage increment includes: in response to determining that the number of first phase non-erased memory cells satisfies the first phase threshold number of non-erased memory cells, assigning a predetermined increment value to the erase voltage increment; and in response to determining that the number of first phase erased memory cells does not satisfy the first phase threshold number of non-erased memory cells, determining the erase voltage increment in accordance with the number of first phase non-erased memory cells.

(B3) In some embodiments of the method of any of B1-B2, the method includes, subsequent to performing the second phase of the erase operation, determining a second phase erase statistic for the second phase of the erase operation; determining, in accordance with the second phase erase statistic, a next value of the erase voltage increment; increasing the erase voltage by the determined erase voltage increment; and performing a third erase phase of the multi-phase erase operation using the increased erase voltage.

(B4) In some embodiments, of the method of B3, determining the next value of erase voltage increment includes: in response to determining that a number of second phase non-erased memory cells satisfies a second phase threshold number of non-erased memory cells, assigning the predetermined increment value to the erase voltage increment; and in response to determining that the number of second phase erased memory cells does not satisfy the second phase threshold number of non-erased memory cells, determining the erase voltage increment in accordance with the number of second phase non-erased memory cells. Furthermore, the second phase threshold number of non-erased memory cells is different than the first phase threshold number of non-erased memory cells.

(B5) In some embodiments of the method of any of B1-B4, the method includes, subsequent to performing all phases of the multi-phase erase operation for the portion of the one or more non-volatile memory devices, determining whether a number of non-erased memory cells of the portion of the one or more non-volatile memory devices satisfies a final threshold.

(B6) In some embodiments of the method of B5, the method includes, in response to determining that the number of non-erased memory cells for the portion of the one or more non-volatile memory devices does not satisfy the final threshold, performing a heroic erase operation.

(B7) In some embodiments of the method of B6, the method includes, subsequent to performing the heroic erase operation, performing an additional determination of whether the number of non-erased memory cells for the portion of the one or more non-volatile memory devices does not satisfy the final threshold; and in response to determining that the number of non-erased memory cells for the portion of the one or more non-volatile memory devices does not satisfy the final threshold, storing an indication that the portion of the one or more non-volatile memory devices is retired.

(B8) In some embodiments of the method of any of B1-B7, the method includes, subsequent to performing all phases of the multi-phase erase operation, determining an erase health value for the portion of the one or more non-volatile memory devices.

(B9) In some embodiments of the method of any of B1-B8, the portion of the one or more non-volatile memory devices is a block of flash memory.

(B10) In another aspect, a storage system includes a storage medium, one or more processors, and memory storing one or more programs, which when executed by the one or more processors cause the storage system to perform an erase operation on a portion of the one or more non-volatile memory devices, by performing a sequence of erase phase operations until an erase operation stop condition is satisfied. Each erase phase operation includes performing an erase phase on the portion of the one or more non-volatile memory devices using an erase voltage, and determining an erase phase statistic for the erase phase. For each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment based on the erase phase statistic for the prior erase phase operation.

(B11) In some embodiment of the storage system of B10, the one or more programs include instructions that when executed by the one or more processors cause the storage system to perform the method of any of A1 to A10 and B1 to B9.

(B12) In yet another aspect, a storage system includes non-volatile memory, one or more processors, and means for performing of the method of any one of A1 to A10 and B1 to B9, described above.

(B13) In yet another aspect, a non-transitory computer-readable storage medium stores one or more programs configured for execution by one or more processors of a storage system, the one or more programs including instructions for causing the storage device to perform the method of any one of A1 to A10 and B1 to B9 described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1A is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 132, and is used in conjunction with or includes a computer system 110 (e.g., a host system or a host computer). In some embodiments, storage medium 132 is a single flash memory device while in other embodiments storage medium 132 includes a plurality of flash memory devices. In some embodiments, storage medium 132 is NAND-type flash memory or NOR-type flash memory. In some embodiments, storage medium 132 includes one or more three-dimensional (3D) memory devices. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 132 is coupled to storage controller 124 through connections 103. Connections 103 are sometimes called data connections, but typically convey commands in addition to data, and optionally convey metadata, error correction information and/or other information in addition to data values to be stored in storage medium 132 and data values read from storage medium 132. In some embodiments, however, storage controller 124 and storage medium 132 are included in the same device (i.e., an integrated device) as components thereof. Furthermore, in some embodiments, storage controller 124 and storage medium 132 are embedded in a host device (e.g., computer system 110), such as a mobile device, tablet, other computer or computer controlled device, and the methods described herein are performed, at least in part, by the embedded storage controller. Storage medium 132 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Memory devices (e.g., NVM 134-1, NVM 134-2, etc.) of storage medium 132 include addressable and individually selectable blocks, such as selectable portion of storage medium 136 (also referred to herein as selected portion 136). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, a storage medium I/O interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to storage medium 132 though connections 103. In some embodiments, storage medium I/O 128 includes read and write circuitry, including circuitry capable of providing reading signals to storage medium 132 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium I/O 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Additional module(s) 125 are coupled to storage medium I/O 128, host interface 129, and management module 121-1. As an example, additional module(s) 125 may include an error control module to limit the number of uncorrectable errors inadvertently introduced into data during writes to memory or reads from memory. In some embodiments, additional module(s) 125 are executed in software by the one or more CPUs 122-1 of management module 121-1, and, in other embodiments, additional module(s) 125 are implemented in whole or in part using special purpose circuitry (e.g., to perform data encoding and decoding functions). In some embodiments, additional module(s) 125 are implemented in whole or in part by software executed on computer system 110.

Figure 1B:
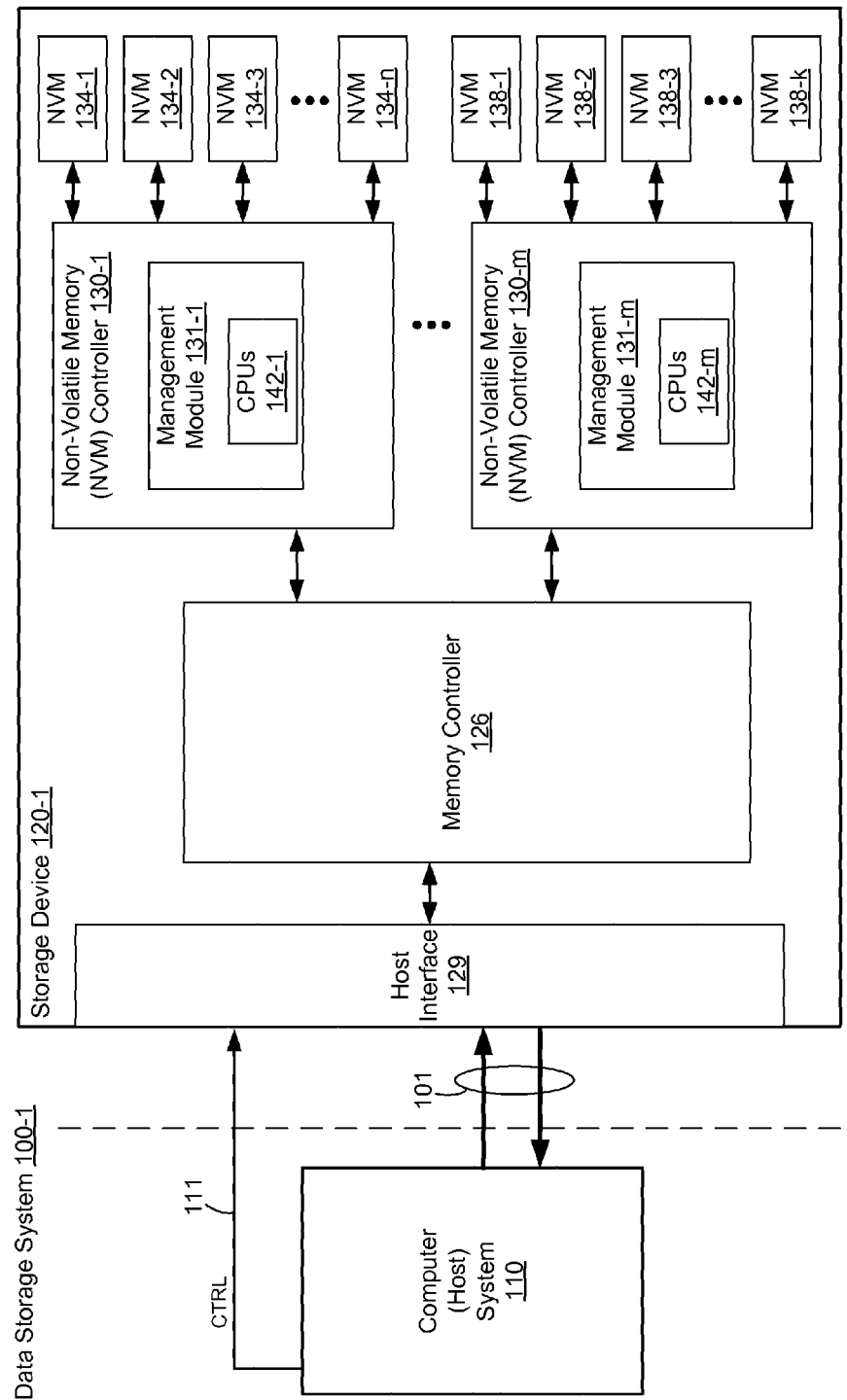
FIG. 1B is a block diagram illustrating an implementation of a data storage system, in accordance with some embodiments.

FIG. 1B is a block diagram illustrating an implementation of a data storage system 100-1, in accordance with some embodiments. While some exemplary features are illustrated, various other features have not been illustrated for the sake of brevity and so as not to obscure more pertinent aspects of the example implementations disclosed herein. To that end, as a non-limiting example, data storage system 100 includes storage device 120-1, which includes host interface 129, memory controller 126, one or more non-volatile memory controllers (e.g., non-volatile memory controller(s) 130), and non-volatile memory (e.g., one or more non-volatile memory device(s) 134, 138), and is used in conjunction with computer system 110. Storage device 120-1 may include various additional features that have not been illustrated for the sake of brevity and so as not to obscure more pertinent features of the example implementations disclosed herein, and a different arrangement of features may be possible. Host interface 129 provides an interface to computer system 110 through data connections 101.

Memory controller 126 is coupled to host interface 129, and non-volatile memory controllers 130. In some implementations, during a write operation, memory controller 126 receives data from computer system 110 through host interface 129 and during a read operation, memory controller 126 sends data to computer system 110 through host interface 129. Further, host interface 129 provides additional data, signals, voltages, and/or other information needed for communication between memory controller 126 and computer system 110. In some embodiments, memory controller 126 and host interface 129 use a defined interface standard for communication, such as double data rate type three synchronous dynamic random access memory (DDR3). In some embodiments, memory controller 126 and non-volatile memory controllers 130 use a defined interface standard for communication, such as serial advance technology attachment (SATA). In some other implementations, the device interface used by memory controller 126 to communicate with non-volatile memory controllers 130 is SAS (serial attached SCSI), or other storage interface. In some implementations, memory controller 126 includes one or more processing units (sometimes herein called CPUs, processors, or hardware processors, and sometimes implemented using microprocessors, microcontrollers, or the like) configured to execute instructions in one or more programs (e.g., in memory controller 126). In some implementations, the one or more processors are shared by one or more components within, and in some cases, beyond the function of memory controller 126.

In some embodiments, the non-volatile memory controllers 130 include management modules 131 (e.g., management module 121-1, FIG. 1A). In some embodiments, the management modules 131 each include one or more processing units 142 (sometimes herein called CPUs, processors, or hardware processors, and sometimes implemented using microprocessors, microcontrollers, or the like) configured to execute instructions in one or more programs (e.g., in management module 131).

Figure 2:
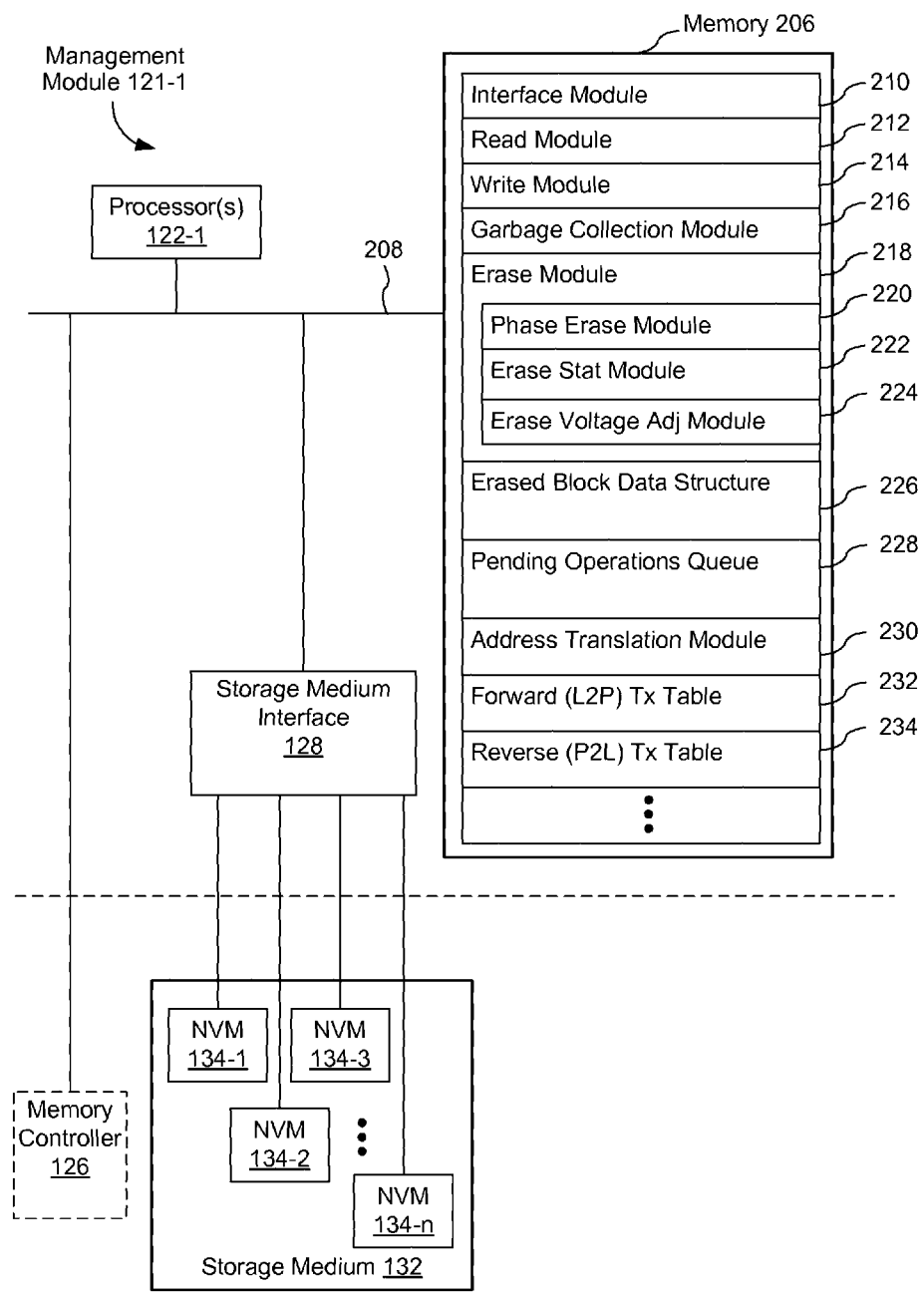
FIG. 2 is a block diagram illustrating a memory management module of a non-volatile memory controller, in accordance with some embodiments.

FIG. 2 is a block diagram illustrating an implementation of a management module 121-1, 121-2, 131-1, or 131-$m$ (hereinafter management module 121 unless specifically designated otherwise), in accordance with some embodiments. Management module 121 typically includes one or more processing units 122-1 (sometimes herein called CPUs, processors, or hardware processors, and sometimes implemented using microprocessors, microcontrollers, or the like) for executing modules, programs and/or instructions stored in memory 206 and thereby performing processing operations, memory 206 (sometimes herein called controller memory), and one or more communication buses 208 for interconnecting these components. Communication buses 208 optionally include circuitry (sometimes called a chipset) that interconnects and controls communications between system components. In some embodiments, such as those represented by FIG. 1B, management module 131 is coupled to memory controller 126 by communication buses 208, and is coupled to non-volatile memory devices 134 (e.g., non-volatile memory devices 134-1 through 134-$n$, and where applicable, 138-1 through 138-$k$) by communication buses 208 and storage medium interface 128.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 122-1. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- an interface module 210 that is used for communicating with other components, such as memory controller 126, and non-volatile memory devices 134;
- a read module 212 used for reading from non-volatile memory devices 134;
- a write module 214 used for writing to non-volatile memory devices 134;
- a garbage collection module 26 that is used for controlling a garbage collection process in a storage medium (e.g., storage medium 132, FIG. 1A);
- an erase module 216 that is used for erasing portions (e.g., selectable portion 136) of storage medium 132;
- an erase block data structure 226 that stores erase information associated with erased memory portions (e.g., erased blocks) in storage medium 132);
- a pending operations queue 228 that catalogs operations (e.g., host requested reads and writes) waiting to be performed on portions of storage medium 132;
- an address translation module 230 that is used for mapping logical addresses to physical addresses;
- a forward table 232 that is used to translate between logical addresses and physical addresses in storage medium 132; and
- reverse table 234 that stores information for translating physical addresses to logical address and, optionally, to store metadata corresponding to the physical addresses, and is used for garbage collection and for recovering from a power loss (in some embodiments, reverse table 234 incorporates erase block data structure 226).

In some embodiments, the erase module 216 includes a phase erase module 220 that is used for performing erase operations on portions (e.g., selectable portion 136) of storage medium 132. In some embodiments, the phase erase module 220 performs an erase operation in successive phases or stages (i.e., the single erase operation is divided into phases). Further, parameters associated with each subsequent phase of the erase operation are adjusted in accordance with metrics of performance of a previous phase, referred to hereinafter as erase statistics. For example, in some embodiments, a voltage used for a subsequent phase will be adjusted in accordance with the erase statistics of the previous phase. Erase statistics are discussed in further detail below.

In some embodiments, the erase module 216 includes an erase statistic module 222 that is used for determining an erase statistic for each erase phase of an erase operation. For example, in some embodiments, the erase statistic for a particular erase phase will correspond to a measurement of success in erasing a portion of memory in storage medium 132.

In some embodiments, the erase module 216 includes an erase voltage adjustment module 224 that is used for adjusting a voltage applied during an erase operation. For example, in some embodiments, the erase voltage adjustment module 224 determines an erase voltage increment, by which the erase voltage is increased from one erase phase to the next, in accordance with the erase statistic for the last completed erase phase. As described in more detail below, when the erase statistic for the last completed erase phase indicates that the last completed erase phase was successful, the erase voltage increment is a default value (e.g., a fixed value, or a value read from a table of default erase voltage increments). However, when the erase statistic for the last completed erase phase indicates that the last completed erase phase was not successful, the erase voltage increment is computed based on the erase statistic for the last completed erase phase (e.g., by applying a mathematical function of the erase statistic for the last completed erase phase).

Each of the above identified elements may be stored in one or more of the previously mentioned memory devices that together form memory 206, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 5, 6, 7A-7C and 8A-8D.

Although FIG. 2 shows management module 121-1, FIG. 2 is intended more as a functional description of the various features which may be present in a non-volatile memory controller than as a structural schematic of the embodiments described herein. In practice, and as recognized by those of ordinary skill in the art, items shown separately could be combined and some items could be separated. Further, although FIG. 2 shows management module 121-1, erase module 218 and optionally other modules shown in FIG. 2 are implemented in management module 121-2, FIG. 1A, or management modules 131-1 through 131-m, FIG. 1B.

As discussed below with reference to FIG. 3A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically means the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3A:
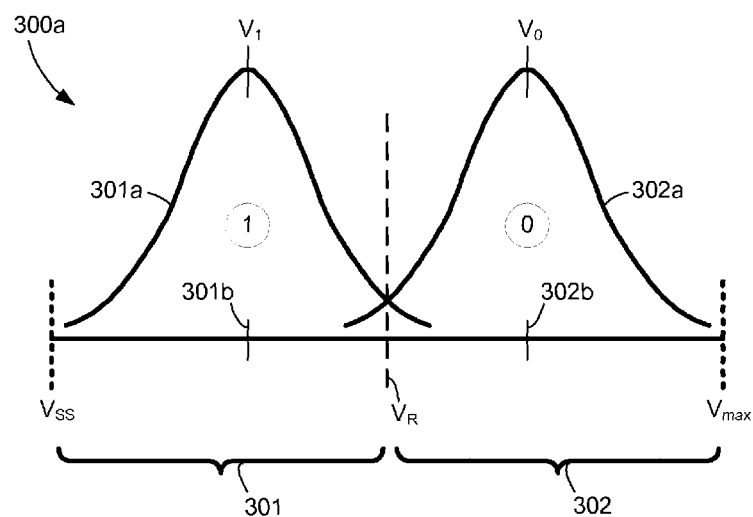
FIG. 3A is a prophetic diagram of voltage distributions that may be found in a single-level flash memory cell (SLC) over time, in accordance with some embodiments.

FIG. 3A is a simplified, prophetic diagram of voltage distributions 300a found in a single-level flash memory cell (SLC) over time, in accordance with some embodiments. The voltage distributions 300a shown in FIG. 3A have been simplified for illustrative purposes. In this example, the SLC's voltage range extends approximately from a first voltage, $V_{SS}$ (e.g., 0 volts), and the maximum allowed gate voltage, $V_{max}$ (e.g., 6 volts). As such, voltage distributions 300a extend between $V_{SS}$ and $V_{max}$.

Sequential voltage ranges 301 and 302 between voltages $V_{SS}$ and $V_{max}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
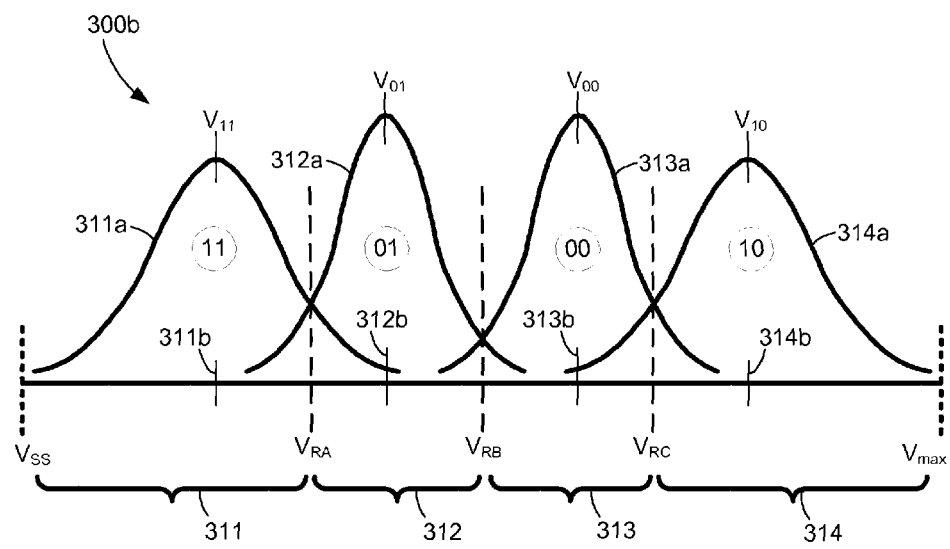
FIG. 3B is a prophetic diagram of voltage distributions that may be found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of a MLC approximately extends from a first voltage, $V_{SS}$, to a maximum gate voltage, $V_{max}$. As such, voltage distributions 300b extend between $V_{SS}$ and $V_{max}$.

Sequential voltage ranges 311, 312, 313, 314 between voltages $V_{SS}$ and $V_{max}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 3B uses an example in which q=2 (i.e., 2 bits per cell in a MLC flash memory), those skilled in the art will appreciate that the embodiments described herein may be extended to memory cells that have more than four possible states per cell, yielding more than two bits of information per cell. For example, in some embodiments, a triple-level memory cell (TLC) has eight possible states per cell, yielding three bits of information per cell. As another example, in some embodiments, a quad-level memory cell (QLC) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

FIGS. 4A-4D are conceptual diagrams of the distributions of memory cell voltages during a multi-phase erase operation (also referred to as an erase operation) performed on a storage device, in accordance with some embodiments. More specifically, FIGS. 4A-4D represent simplified, prophetic diagrams of voltage distributions found in a multi-level flash memory cell (MLC) having 2 bits per cell. It will be understood that numerous flash memory configurations, having various numbers of bits per cells, can be used (e.g., 1 bit per cell (SLC), 2 bits per cell (MLC), 3 bits per cell (TLC), etc.). As shown, the prophetic diagrams each have an X-axis and a Y-axis. The X-axis corresponds to cell voltages for the non-volatile memory cells (e.g., flash memory cells) in a portion 136 of storage medium 132 (e.g., an individually selectable block, and more generally a selectable portion 136 of storage medium 132, FIG. 1A). The Y-axis corresponds to a number of non-volatile memory cells in the portion 136 of storage medium 132 having each cell voltage shown along the X-axis.

Figure 4A:
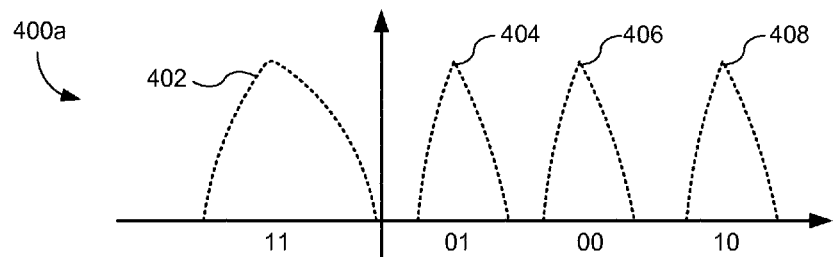
FIGS. 4A-4D are conceptual diagrams of a multi-phase erase operation performed on a storage device.

FIG. 4A is a conceptual diagram of the distribution of memory cell voltages in the selected portion 136 (e.g., a block) of storage medium 132 in a programmed state 400a, prior to the start of an erase operation, in accordance with some embodiments. Memory cell voltage distribution 402 corresponds to erased memory cells, memory cell voltage distribution 404 corresponds to memory cells storing a value of "01," memory cell voltage distribution 406 corresponds to memory cells storing a value of "00," and memory cell voltage distribution 408 corresponds to memory cells storing a value of "10."

Figure 4B:
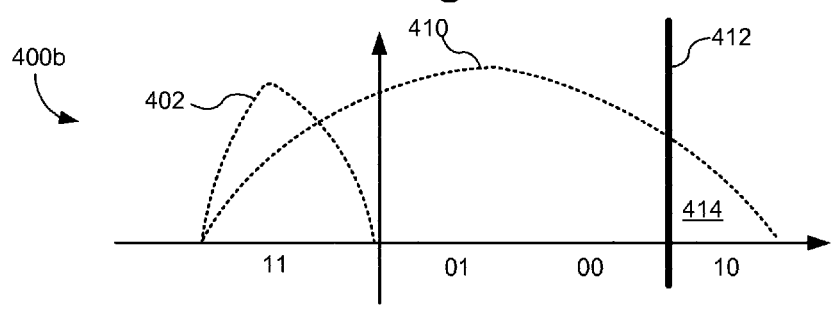

FIG. 4B is a conceptual diagram of the distribution of memory cell voltages in the same selected portion 136 (e.g., a block) of storage medium 132 as in FIG. 4A, in a partially erased state 400b, after a first erase phase of an erase operation, in accordance with some embodiments. The first erase phase of the erase operation uses an erase voltage to partially erase non-volatile memory cells from the selected portion 136 of storage medium 132. During the first erase phase, the cell voltages of the memory cells that previously corresponded to values "01," "00," and "10," are reduced, represented by a shift to the left in FIG. 4B. The amount by which each cell voltage changes during each erase phase of the erase operation varies, and FIG. 4B shows a conceptual diagram of the resulting distribution 410 of memory cell voltages.

Subsequent to the first erase phase, the storage device (during an erase verify operation or optionally a read operation) determines the states of the memory cells in the selected portion 136 of storage medium 132 by applying a first-phase erase verify 412 (e.g., applying a reading threshold voltage as discussed above with reference to FIGS. 3A-3B) to the selected portion 136. Memory cells having a cell voltage below (i.e., left of) the erase verify voltage 412 are said to satisfy a criterion for the first erase phase, whereas memory cells 414 having a cell voltage above (i.e., right of) the erase verify voltage 412 are said to not satisfy (or fail) the criterion for the first erase phase. Memory cells 414 are sometimes, for convenience, called "non-erased memory cells." However, it should be noted that many memory cells that satisfy the criterion for the first erase phase are not truly "erased," rather they are sufficiently erased to satisfy the criterion for the first erase phase (e.g., memory cells that are sufficiently erased are memory cells whose cell voltage is below the erase verify voltage).

In some embodiments, the storage device determines the number of non-erased memory cells 414, after the first erase phase, and determines whether that number satisfies a first erase phase threshold number of non-erased memory cells (also referred to as an erase phase threshold). For example, if the first erase phase threshold number of non-erased memory cells is, say, 33% of the memory cells in the selected portion 136, the number of non-erased memory cells 414, after the first erase phase, satisfies the first erase phase threshold number of non-erased memory cells if the number of non-erased memory cells 414 is less than 33%. Stated another way, if the number of non-erased memory cells after an erase phase is less than the corresponding threshold number, then the phase-specific threshold number is satisfied.

Figure 4C:
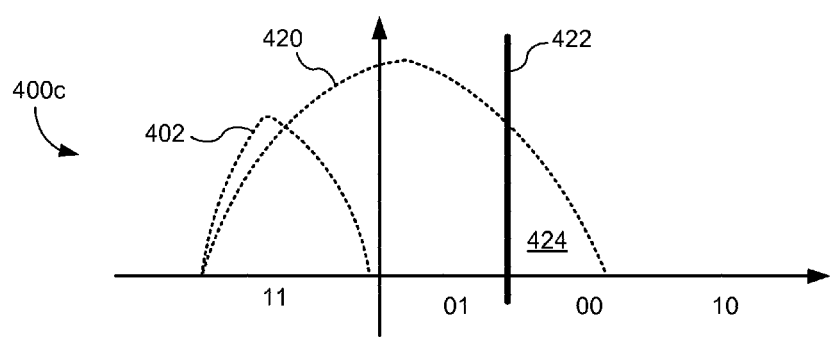

FIG. 4C is a conceptual diagram of the distribution of memory cell voltages in the same selected portion 136 (e.g., a block) of storage medium 132 as in FIGS. 4A and 4B, in a partially erased state 400c, after a second erase phase of the erase operation, in accordance with some embodiments. The second erase phase of the erase operation uses a second erase voltage (typically higher than the erase voltage used in the first erase phase) to partially erase non-volatile memory cells from the selected portion 136 of storage medium 132. During the second erase phase, the cell voltages of the memory cells that previously corresponded to values "01," "00," and "10," are further reduced, represented by a shift to the left in FIG. 4C. The amount by which each cell voltage changes during each phase of the erase operation varies, and FIG. 4C shows a conceptual diagram of the resulting distribution 420 of memory cell voltages.

Subsequent to the second erase phase, the storage device (during an erase verify operation or optionally a read operation) determines the states of the memory cells in the selected portion 136 of storage medium 132 by applying an second-phase erase verify or reading threshold voltage 422 to the selected portion 136. Memory cells having a cell voltage below (i.e., left of) the erase verify voltage 422 are said to satisfy a criterion for the second erase phase, whereas memory cells 424 having a cell voltage above (i.e., right of) the erase verify voltage 422 are said to not satisfy (or fail) the criterion for the second erase phase. As discussed above, memory cells 424 are sometimes, for convenience, called "non-erased memory cells." However, it should be noted that many memory cells that satisfy the criterion for the second erase phase are not truly "erased," rather they are sufficiently erased to satisfy the criterion for the second erase phase.

In some embodiments, the storage device determines the number of non-erased memory cells 424, after the second erase phase, and determines whether that number satisfies a second phase threshold number of non-erased memory cells. For example, if the second erase phase threshold number of non-erased memory cells is, say, 66% of the memory cells in the selected portion 136, the number of non-erased memory cells 424, after the second erase phase satisfies the second phase threshold number of non-erased memory cells if the number of non-erased memory cells 424 is less than 66%. Stated another way, if the number of non-erased memory cells after an erase phase is less than the corresponding threshold number, then the phase-specific threshold number is satisfied.

Figure 4D:
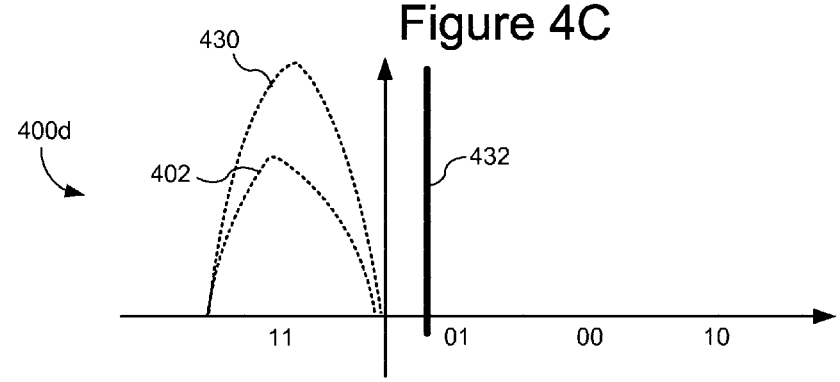

FIG. 4D is a conceptual diagram of the distribution 430 of memory cell voltages in the same selected portion 136 (e.g., a block) of storage medium 132 as in FIGS. 4A-4C, in a fully erased state 400d, after a final erase phase of the erase operation, in accordance with some embodiments. As discussed in more detail below, the number of erase phases required to achieve the fully erased state 400d may vary from device to device and even from block to block within a particular device (e.g., storage device 120, FIG. 1A). Furthermore, in the fully erased state 400d, a small number of memory cells in the selected portion 136 may have cell voltages above (i.e., to the right of) the final erase verify voltage 432. Typically, there is a predefined limit on the number of such non-erased memory cells that is consistent with a successful erase operation. Furthermore, in some embodiments the final erase verify voltage 432 is the same as the reading threshold voltage used for distinguishing between erased memory cells and memory cells having a non-erased value.

It is noted that FIGS. 4B-4D are conceptual diagrams in which memory cell voltage distribution 402 for memory cells already in the erased state prior to the erase operation is shown separately from the memory cell voltage distribution of the other memory cells. Alternately, a merged memory cell voltage distribution could have been shown in these Figures.

Figure 5:
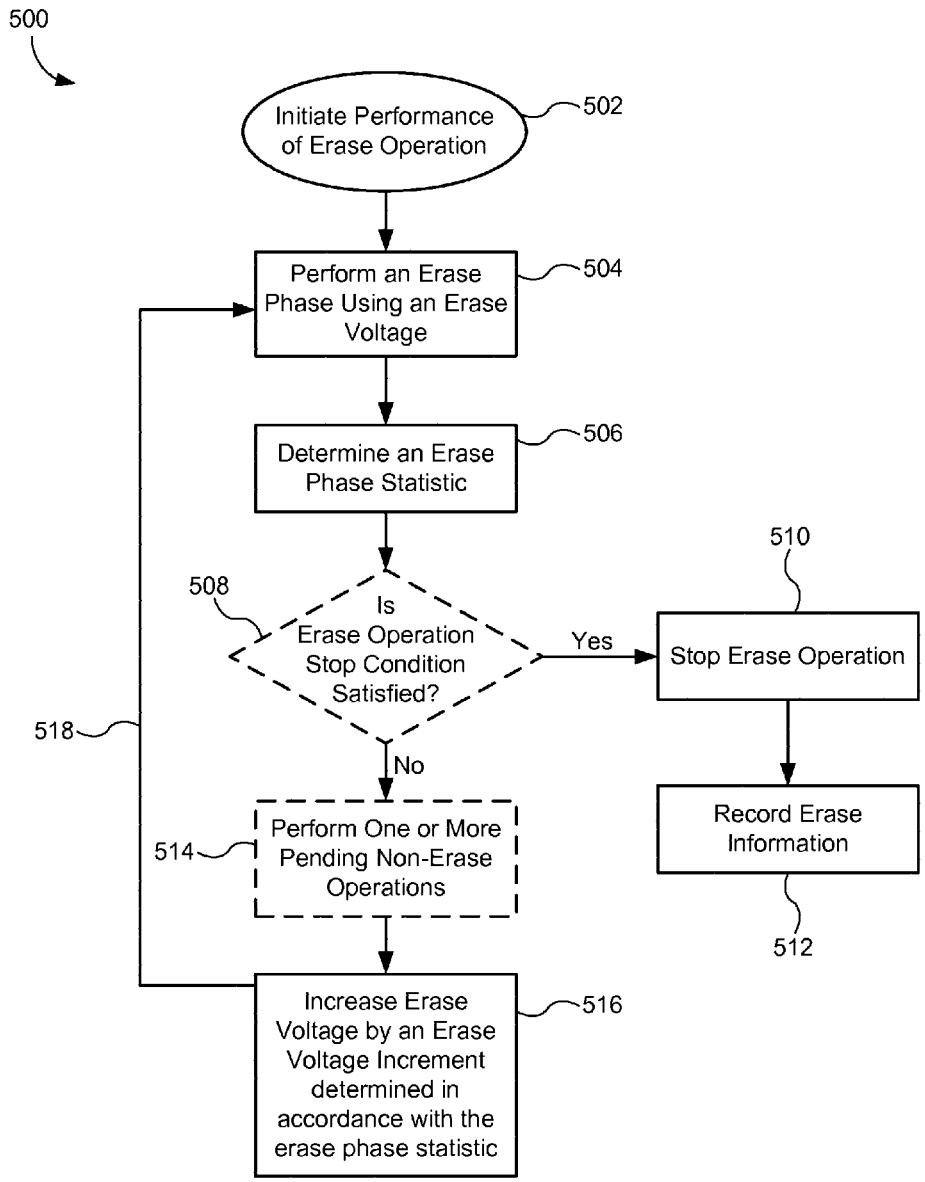
FIG. 5 illustrates a conceptual flowchart representation of a method of erasing data in a storage device using multiple erase phases, in accordance with some embodiments.

FIG. 5 illustrates a conceptual flowchart representation of a method of erasing data in a storage device using multiple erase phases 500, in accordance with some embodiments. With reference to the data storage system 100 pictured in FIG. 1A, in some embodiments, a method 500 is performed by a storage device (e.g., storage device 120, FIG. 1A) or one or more components of the storage device (e.g., storage controller 124). In some embodiments, the method 500 is governed by instructions that are stored in a non-transitory computer-readable storage medium and that are executed by one or more processors of a device, such as the one or more processing units (CPUs) 122-1 of management module 121-1 (FIG. 2).

In some embodiments, some of the operations (or alternatively, steps) of method 500 are performed at a host system (e.g., computer system 110) that is operatively coupled with the storage device and other operations of method 500 are performed at the storage device. In some of these embodiments, method 500 is governed, at least in part, by instructions that are stored in a non-transitory computer-readable storage medium and that are executed by one or more processors (e.g., hardware processors) of the host system (the one or more processors of the host system are not shown in FIG. 1A).

For ease of explanation, the following describes method 500 as performed by the storage device (e.g., by storage controller 124 of storage device 120, FIG. 1A). With reference to FIG. 2, in some embodiments, the operations of method 500 are performed, at least in part, by a read module (e.g., read module 212, FIG. 2), a write module (e.g., write module 214, FIG. 2), and an erase module (e.g., erase module 218, FIG. 2). As shown in FIG. 2, the erase module may include a phase erase module (e.g., phase erase module 220, FIG. 2), an erase statistic module (e.g., erase statistic module 222, FIG. 2), and an erase voltage adjustment module (e.g., erase voltage adjustment module 224, FIG. 2).

The method begins, in some embodiments, when the storage device (e.g., storage device 120, FIG. 1A, or a component thereof such as erase module 218, FIG. 2) initiates (502) performance of an erase operation. In some embodiments, the storage device performs (502) the erase operation on a portion (e.g., selectable portion 136 of storage medium 132, FIG. 1A) of one or more non-volatile memory devices (e.g., NVM 134-1, NVM 134-2, etc. of storage medium 132, FIG. 1A). In some embodiments, the storage device performs a sequence of erase phase operations until an erase operation stop condition is satisfied (508—Yes). An erase phase operation satisfies the erase operation stop condition when substantially all non-volatile memory cells (e.g., bits and/or flash memory cells) in the selected portion 136 of the storage medium 132 are successfully erased. As noted above, the erase operation stop condition is typically satisfied even if an insignificant amount of memory cells remain in a non-erased state. Alternatively, in some embodiments, the storage device performs erase phase operations until a maximum number of erase phase operations are performed or the erase operation stop condition is satisfied, whichever occurs first. Subsequent to performing the maximum number of erase phase operations, and in accordance with a determination that the selected portion 136 fails to satisfy the erase operation stop condition, the storage device retires the selected portion 136 of storage medium 132 from future service.

After initiating performance of the erase operation, the storage device (e.g., storage device 120, FIG. 1A, or a component thereof such as phase erase module 220, FIG. 2) performs (504) an erase phase (e.g., a first erase phase in the sequence of erase phase operations) on the selected portion 136 of storage medium 132 using an erase voltage. In some embodiments, a magnitude of the erase voltage applied during the first erase phase is substantially less than a magnitude required to fully erase the selected portion 136 of storage medium 132. In this way, the first erase phase inflicts minimal damage to the storage medium 132 due to the low magnitude of the erase voltage. The goal of the first erase phase is to satisfy the first erase phase threshold (discussed in more detail below). Thus, the magnitude of the erase voltage applied during the first erase phase is set to a value to satisfy the first erase phase threshold.

The method further includes the storage device (e.g., storage device 120, FIG. 1A, or a component thereof such as erase statistic module 222, FIG. 2) determining (506) an erase phase statistic for the erase phase. In some embodiments, a read operation (e.g., erase verify operation discussed above) is performed subsequent to the erase phase in order for the storage device to determine the erase statistic. As discussed above with reference to FIGS. 4B-4D, the erase verify operation applies an erase verify voltage (e.g., a reading threshold voltage) to the selected portion 136 of the storage medium 132. Memory cells having a cell voltage below the erase verify voltage are said to satisfy a criterion for the erase phase, whereas memory cells having a cell voltage above the erase verify voltage are said to not satisfy (or fail) the criterion for the erase phase. These memory cells (the ones having a cell voltage above the criterion) are sometimes, for convenience, called "non-erased memory cells." In some embodiments, the erase phase statistic for the erase phase is the number (or percentage) of non-erased memory cells after that erase phase in the selected portion 136. Lastly, as noted above, many memory cells that satisfy the criterion for a given erase phase are not truly "erased," rather they are sufficiently erased to satisfy the criterion for the given erase phase.

Subsequent to the erase verify operation, the storage device determines if the number of non-erased memory cells satisfies an erase phase threshold for the erase phase. The erase phase threshold is the number (or percentage) of memory cells that should be erased during the erase phase. In one example, after the first erase phase, no more than 50% of the memory cells in the selected portion 136 should be non-erased memory cells. However, if after the first erase phase, 60% of the memory cells in the selected portion 136 are non-erased memory cells, then the number of non-erased memory cells does not satisfy the erase phase threshold for the first erase phase.

It should be understood that, in some embodiments, the erase phase threshold is distinct from the erase operation stop condition during at least the initial phases of the erase operation. In some embodiments, the two are the same during one or more final erase phases of the erase operation.

The method continues, in some embodiments, when the storage device (e.g., storage device 120, FIG. 1A, or a component thereof such as read module 212, FIG. 2) determines whether (508) the erase operation stop condition is satisfied. As noted above, a first erase phase generally does not satisfy the erase operation stop condition. The goal of the first erase phase is to satisfy the first erase phase threshold as discussed above. Consequently, in some embodiments, operation 508 is optional or not included in one or more of the initial phases of the erase operation.

If, however, the erase operation stop condition is satisfied after performing an erase phase, the storage device (e.g., storage device 120, FIG. 1A, or a component thereof, such as erase module 218, FIG. 2) stops (510) the erase operation. Additionally, in some embodiments, the storage device or a component thereof, such as an erase statistic module (e.g., erase module 218, FIG. 2), records (512) erase information associated with the stopped erase operation. In some embodiments, the erase information includes: a number of erase phases required to satisfy the erase operation stop condition; the erase voltage used during the last erase phase, and optionally the erase voltage used during one or more additional erase phases (e.g., the first erase phase); a number of erase pulses used during one or more of the erase phases; and total time required to satisfy the erase operation stop condition. In some embodiments, the erase information is stored in an erase block data structure (e.g., erase block data structure 226, FIG. 2). In some embodiments, the erase block data structure includes information for multiple portions of storage medium 132. In this way, erase information for a first portion (e.g., NVM 134-1) of storage medium 132 is easily compared to erase information for a second portion (e.g., NVM 134-2) of storage medium 132. Accordingly, the storage device can select a particular portion (e.g., the first portion instead of the second portion) to perform future write operations based on the recorded information in the erase block data structure.

In accordance with a determination that the erase operation stop condition is not satisfied (508—No), in some embodiments, the storage device (e.g., storage device 120, FIG. 1A, or a component thereof, such as read module 212 or write module 214) optionally performs (514) one or more non-erase operations before performing (504) a next erase phase. In some embodiments, the non-erase operations are stored in a pending operations queue (e.g., pending operations queue 228). In this way, the pending non-erase operations, which would otherwise wait for the erase operation to finish, are executed prior to the erase operation finishing. Typically, the storage device considers non-erase operations (e.g., read and/or write operations) requested by the host system as high priority operations. Consequently, if non-erase operations requested by the host system are pending (i.e., waiting to be executed), one or more of those pending operations are performed prior to performing the next erase phase. In some circumstances, only low priority operations (e.g., garbage collection read and write operations) are stored in the pending operations queue. In this circumstance, the storage device either performs the next erase phase (e.g., moves onto step 516) without performing any of the pending low priority non-erase operations, or alternately performs one or more of the pending low priority operations stored in the pending operations queue, depending on how the system is configured.

In accordance with a determination that the erase operation stop condition is not satisfied (508—No), the storage device (e.g., storage device 120, FIG. 1A, or a component thereof such as erase voltage adjustment module 224, FIG. 2) increases (516) the erase voltage by an erase voltage increment determined in accordance with the erase phase statistic. In some embodiments, if the erase phase satisfies or outperforms the erase phase threshold (e.g., the number of non-erased memory cells is less than the erase phase threshold), the erase voltage increment is a default value, and as such, the erase voltage is increased by the default value. Further, if the erase phase does not satisfy the erase phase threshold (e.g., the number of non-erased memory cells is greater than the erase phase threshold), the erase voltage increment is based on the erase phase statistic. For example, the increase in the erase voltage for the next erase phase can be represented by the following equations:

$$\Delta \text{Erase} = \text{function}(\text{non-erased memory cell(s) count} - \text{erase phase threshold})$$
$$V_{erase}(\text{next phase}) = V_{erase}(\text{current phase}) + \Delta \text{Erase}$$

where $\Delta$Erase is the erase voltage increment, $V_{erase}$ is the erase voltage for a particular erase phase of the erase operation, and "function" is a predefined mathematical function of its argument. In some embodiments, the function is a linear function of the difference between the count of non-erased memory cells and the erase phase threshold, such as A+B*dif, where A is typically equal to or larger than a default erase voltage increment, B is a scaling coefficient, and "dif" is the difference between the count of non-erased memory cells and the erase phase threshold. As discussed above, in some embodiments, the erase phase threshold is the number (or percentage) of memory cells that should be erased during the erase phase.

In some embodiments, the default value is consistent across all erase phases of the erase operation (i.e., erase voltage increases linearly throughout the erase operation if every erase phases is "successful"). In some other embodiments, the default value increases inconsistently between each successive erase phase (e.g., beginning erase phases have small erase voltage increments while later erase phases have larger erase voltage increments, or vice versa).

The method continues (518) with the storage device (e.g., storage device 120, FIG. 1A, or a component thereof such as erase module 218, FIG. 2) performing a next phase of the erase operation (starting at 504) using the increased erase voltage. In this way, at least operations 504, 506, and 508 are performed again by the storage device. The method will continue to perform additional erase phases until the erase stop condition (508) is satisfied or a maximum number of erase phases are performed, whichever occurs first.

In some embodiments, the storage device or host system (host system 110, FIG. 1A) establishes a maximum number of erase phases to be performed on the selected portion 136 in order to satisfy a final threshold. In some embodiments, the storage device sets a final erase voltage to a strongest available erase voltage during a last allowable erase phase of the maximum number of erase phases or in a heroic erase operation (using the strongest available erase voltage) performed after the last allowable erase phase. In accordance with a determination that the last allowable erase phase is unsuccessful in satisfying the final threshold, in some embodiments, the storage device either retires or reserves for low priority read and write operations (e.g., read and write operations not from a host system) the selected portion 136. In some embodiments, when the last allowable erase phase (or any earlier erase phase) satisfies the final threshold, the storage device marks the selected portion 136 as successfully erased and also available for future read and writes operations.

Subsequent to stopping the erase operation, the storage device (e.g., storage device 120, FIG. 1A, or a components thereof, such as read module 212, write module 214, and/or erase module 218, FIG. 2) performs or initiates performance of a next operation in an operation queue (e.g., pending operations queue 228, FIG. 2). Typically, the next operation is selected from the set consisting of: an erase operation, a host requested read operation, a host requested write operation, a garbage collection initiated read operation, and a garbage collection initiated write operation. However, in some embodiments other types of operations, for example unmap operations (sometimes called trim operations), may also be included in the operation queue. In this way, the storage device continually performs operations, so long as there are operations pending in its operation queue.

Additional details concerning each of the processing steps for method 500, as well as details concerning additional processing steps, are presented below with reference to FIGS. 7A-7C.

Figure 6:
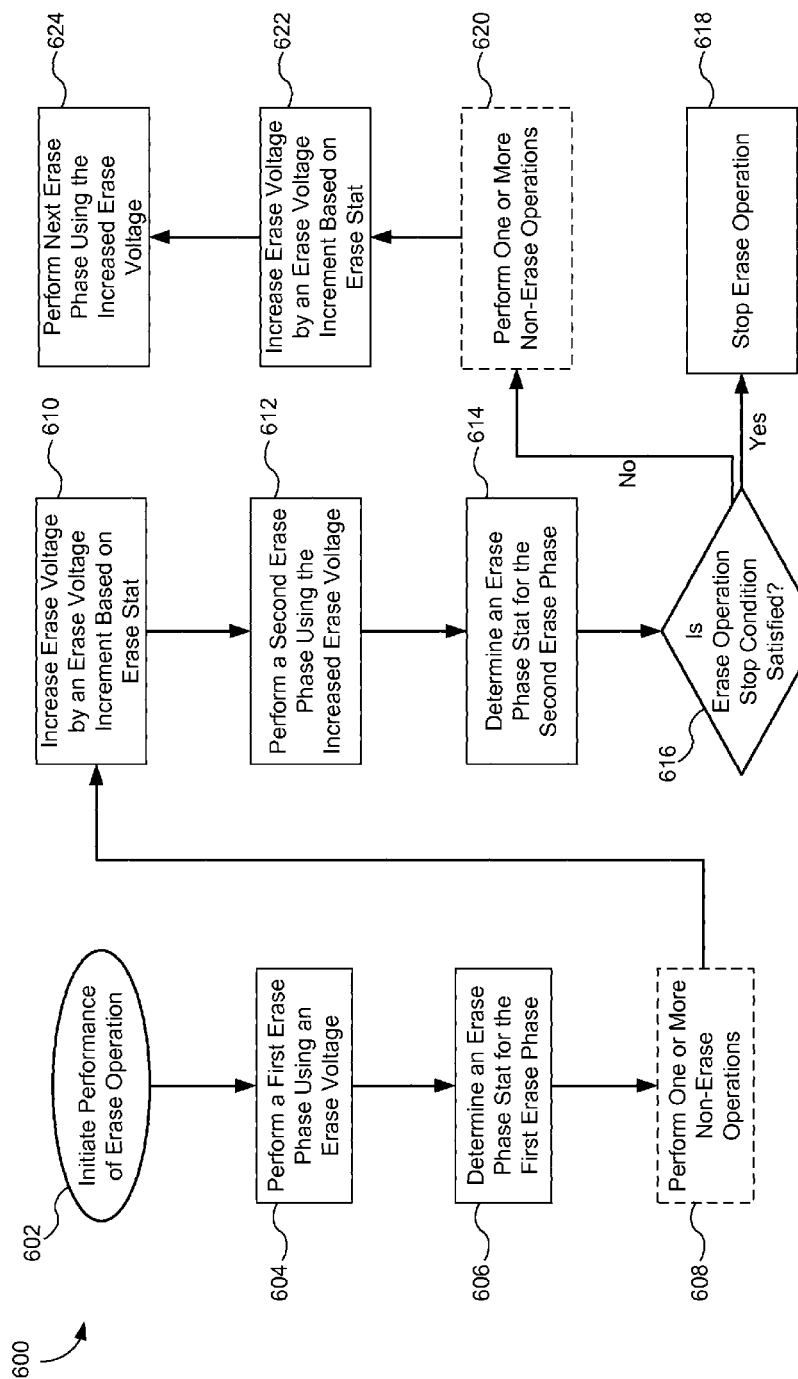
FIG. 6 illustrates a conceptual flowchart representation of a method of erasing data in a storage device using multiple erase phases, in accordance with some embodiments.

FIG. 6 illustrates a conceptual flowchart representation of a method of erasing data in a storage device using multiple erase phases 600, in accordance with some embodiments. With reference to the data storage system 100 pictured in FIG. 1A, in some embodiments, a method 600 is performed by a storage device (e.g., storage device 120) or one or more components of the storage device (e.g., storage controller 124). In some embodiments, the method 600 is governed by instructions that are stored in a non-transitory computer-readable storage medium (e.g., controller memory 206, FIG. 2) and that are executed by one or more processors of a device, such as the one or more processing units (CPUs) 122-1 of management module 121-1 (FIG. 2).

The method begins, in some embodiments, when the storage device (e.g., storage device 120, FIG. 1A, or a component thereof such as erase module 218, FIG. 2) initiates (602) performance of an erase operation on a portion (e.g., selectable portion 136 of storage medium 132, FIG. 1A) of one or more non-volatile memory devices (e.g., NVM 134-1, NVM 134-2, etc. of storage medium 132, FIG. 1A).

The method continues, in some embodiments, when the storage device (e.g., storage device 120, FIG. 1A, or a component thereof such as phase erase module 220, FIG. 2) performs (604) a first erase phase on the selected portion 136 of storage medium 132 using an erase voltage, as further explained above with reference to operation 504 of method 500.

The method further includes the storage device (e.g., storage device 120, FIG. 1A, or a component thereof such as erase statistic module 222, FIG. 2) determining (606) an erase phase statistic for the first erase phase, as further explained above with reference to operation 506 of method 500.

Next, the storage device (e.g., storage device 120, FIG. 1A, or a component thereof such as read module 212 or write module 214) optionally performs (608) one or more non-erase operations, as further explained above with reference to operation 514 of method 500. It is noted that in some embodiments, as represented in FIG. 6, a check for satisfying the erase operation stop condition is not performed at the end of the first erase phase, since it is known that the stop condition will not be satisfied at this point in the erase operation.

The method continues with the storage device (e.g., storage device 120, FIG. 1A, or a component thereof, such as erase voltage adjustment module 224, FIG. 2) increasing (610) the erase voltage by an erase voltage increment determined in accordance with the erase phase statistic, as further explained above with reference to operation 516 of method 500.

Next, the storage device (e.g., storage device 120, FIG. 1A, or a component thereof such as phase erase module 220, FIG. 2) performs (612) a second erase phase on the selected portion 136 of storage medium 132 using the increased erase voltage, and determines (614) an erase phase statistic for the second erase phase, as further explained above with reference to operations 504 and 506 of method 500.

The method continues, in some embodiments, when the storage device (e.g., storage device 120, FIG. 1A, or a component thereof such as read module 212, FIG. 2) determines whether (616) the erase operation stop condition is satisfied. If the second erase phase satisfies (616—Yes) the erase operation stop condition, the storage device (e.g., storage device 120, FIG. 1A, or a component thereof such as erase module 218, FIG. 2) stops (618) the erase operation, as further explained above with reference to operations 508 and 510 of method 500. In some embodiments, operation 616 is not performed after the second erase phase but is instead performed during a later erase phase of the erase operation (e.g., after performance of a third erase phase).

In accordance with a determination that the erase operation stop condition is not satisfied (616—No), the storage device (e.g., storage device 120, FIG. 1A, or a component thereof, such as read module 212 or write module 214) optionally performs (620) one or more non-erase operations, such as one or more read operations, as further explained above with reference to operation 514 of method 500.

Next, the storage device (e.g., storage device 120, FIG. 1A, or a component thereof such as erase voltage adjustment module 224, FIG. 2) increases (622) the erase voltage by an erase voltage increment determined in accordance with the erase phase statistic, and performs (624) a next erase phase on the selected portion 136 of storage medium 132 using the increased erase voltage, as further explained above with reference to operations 516 and 504 of method 500. It should be understood that operations 612-624 can be performed numerous times, thereby performing additional phases of the erase operation, until the erase operation stop condition is satisfied.

Additional details concerning each of the processing steps for method 600, as well as details concerning additional processing steps, are presented below with reference to FIGS. 8A-8D.

Figure 7A:
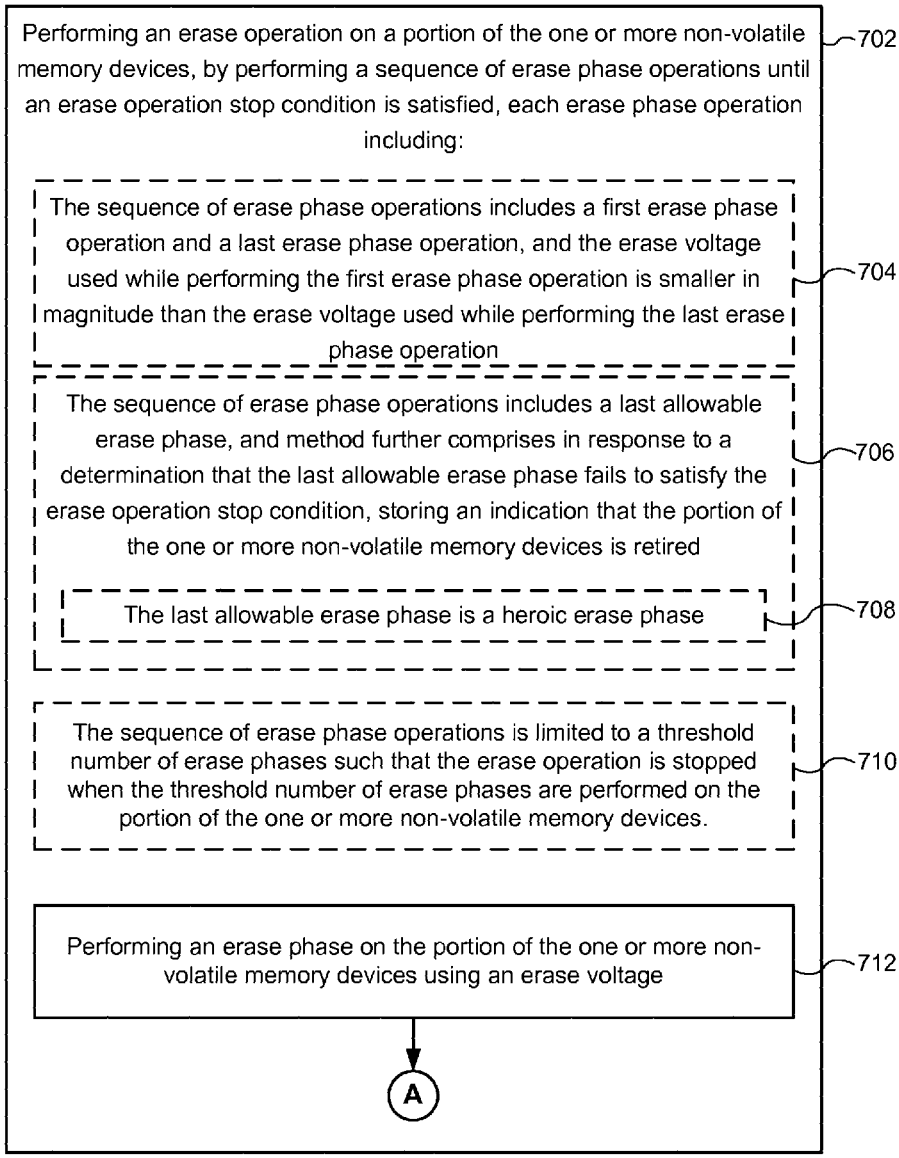
FIGS. 7A-7C illustrate a flowchart representation of a method of erasing memory on a storage device using multiple erase phases, in accordance with some embodiments.
Figure 7B:
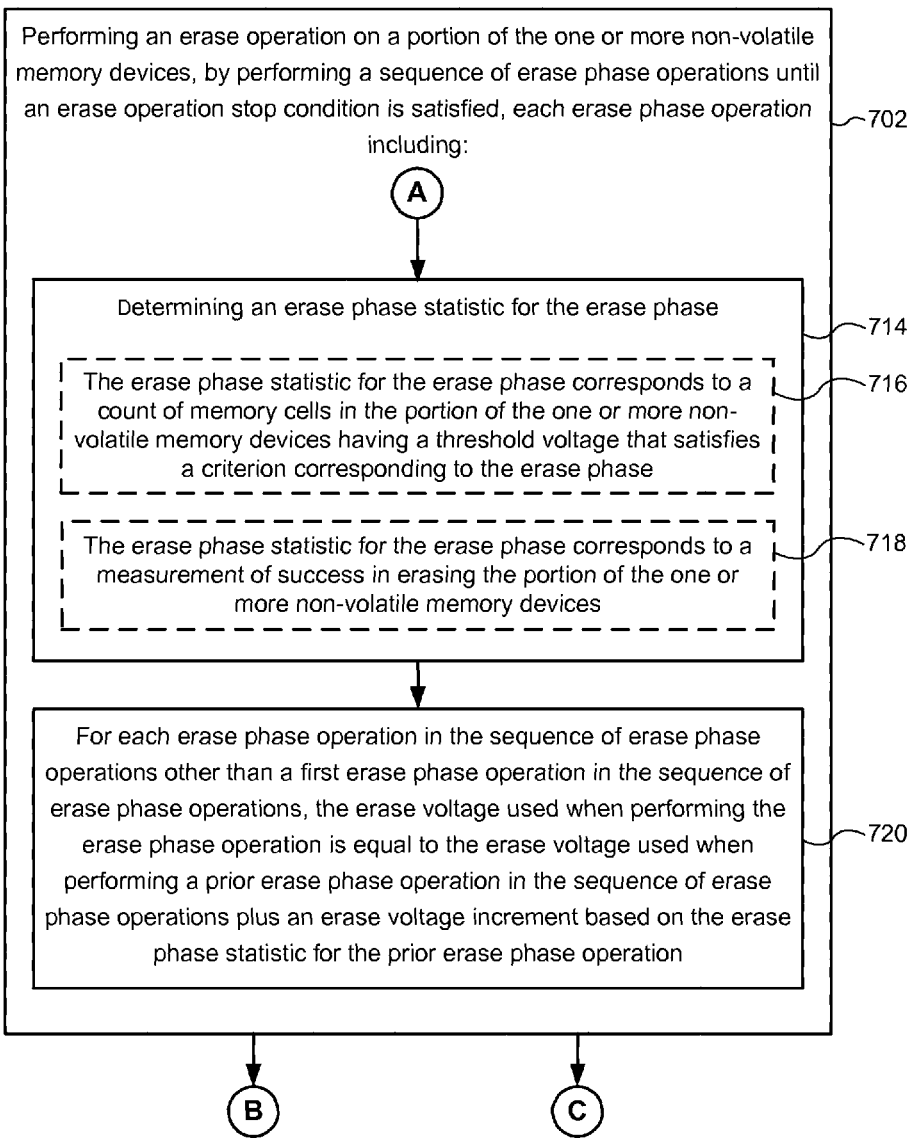
Figure 7C:
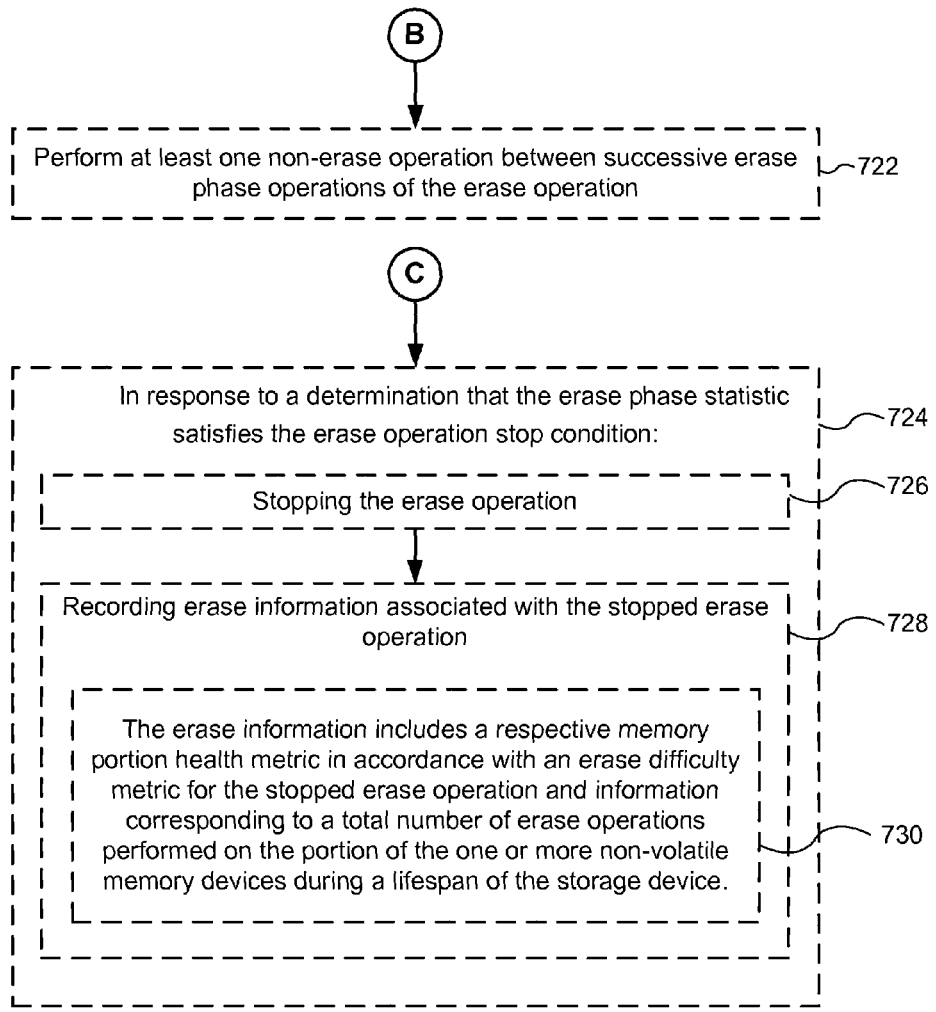

FIGS. 7A-7C illustrate a flowchart representation of a method of erasing memory on a storage device using multiple erase phases, in accordance with some embodiments. With reference to the data storage system 100 pictured in FIG. 1A, in some embodiments, a method 700 is performed by a storage device (e.g., storage device 120) or one or more components of the storage device (e.g., storage controller 124). In some embodiments, the method 700 is governed by instructions that are stored in a non-transitory computer-readable storage medium (e.g., controller memory 206, FIG. 2) and that are executed by one or more processors of a device, such as the one or more processing units (CPUs) 122-1 of management module 121-1. In some embodiments, some of the operations of method 700 are performed at a host system (e.g., computer system 110) that is operatively coupled with the storage device and other operations of method 700 are performed at the storage device. In some embodiments, method 700 is governed, at least in part, by instructions that are stored in a non-transitory computer-readable storage medium and that are executed by one or more processors of the host system (the one or more processors of the host system are not shown in FIG. 1A).

For ease of explanation, the following describes method 700 as performed by the storage device (e.g., by storage controller 124 of storage device 120, FIG. 1A). With reference to FIG. 2, in some embodiments, the operations of method 700 are performed, at least in part, by a read module (e.g., read module 212, FIG. 2), a write module (e.g., write module 214, FIG. 2), and an erase module (e.g., erase module 218, FIG. 2). As shown in FIG. 2, the erase module may include a phase erase module (e.g., phase erase module 220, FIG. 2), an erase statistic module (e.g., erase statistic module 222, FIG. 2), and an erase voltage adjustment module (e.g., erase voltage adjustment module 224, FIG. 2).

With reference to FIG. 7A, the storage device (e.g., storage device 120, FIG. 1A, or a component thereof such as erase module 218, FIG. 2) performs (702) an erase operation on a portion (e.g., selectable portion 136 of storage device 132, FIG. 1A) of one or more non-volatile memory devices (e.g., NVM 134-1, NVM 134-2, etc. of storage medium 132, FIG. 1A), by performing a sequence of erase phase operations until an erase operation stop condition is satisfied. In the following discussion, the memory portion on which the erase operation is performed is called the selected portion, for ease of reference. In some embodiments, the sequence of erase phase operations includes a first erase phase operation (erase phase operations are also referred to as erase phase(s) and/or phase(s)) and a last erase phase operation, and an erase voltage used while performing the first erase phase operation is smaller in magnitude than an erase voltage used while performing the last erase phase operation (704). In this way, the first erase phase operation inflicts substantially less damage, relative to damage inflicted by the last erase phase operation, to the selected portion of the one or more non-volatile memory devices due to its small magnitude erase voltage. Magnitudes of erase voltages are further explained above with reference to FIG. 5.

In some embodiments, the sequence of erase phase operations includes a last allowable erase phase. Further, in response to a determination that the last allowable erase phase fails to satisfy the erase operation stop condition, the storage device stores an indication that the selected portion of the one or more non-volatile memory devices is retired (706), as further explained above with reference to FIG. 5. The last allowable erase phase is sometimes referred to as a heroic erase phase (708). The heroic erase phase uses the strongest available erase voltage.

In some embodiments, the sequence of erase phase operations is limited to a threshold number of erase phases (also referred to above as a maximum number of erase phases) such that the erase operation is stopped when the threshold number of erase phases are performed on the selected portion of the one or more non-volatile memory devices (710), as further explained above with reference to FIG. 5.

Furthermore, each erase phase operation includes the storage device (e.g., storage device 120, FIG. 1A, or a component thereof such as phase erase module 220, FIG. 2) performing (712) an erase phase on the selected portion of the one or more non-volatile memory devices using an erase voltage, as further explained above with reference to FIG. 5.

Furthermore, each erase phase operation includes the storage device (e.g., storage device 120, FIG. 1A, or a component thereof such as erase statistic module 222, FIG. 2) determining (714) an erase phase statistic for the erase phase. In some embodiments, the erase phase statistic for the erase phase corresponds to a count of memory cells in the portion of the one or more non-volatile memory devices having a threshold voltage that satisfies a criterion corresponding to the erase phase (716), as discussed in further detail above with reference to FIGS. 4B, 4C and 5. In some embodiments, the erase phase statistic for the erase phase corresponds to a measurement of success in erasing (e.g., partially erasing, by lowering memory cell voltages) the selected portion of the one or more non-volatile memory devices (718).

In addition, for each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment based on the erase phase statistic for the prior erase phase operation (720).

In some embodiments or in some circumstances, the storage device performs at least one non-erase operation between successive erase phase operations of the erase operation (722), as further explained above with reference to FIG. 5.

In some embodiments, in response to a determination that the erase phase statistic satisfies the erase operation stop condition (724), the storage device stops (726) the erase operation and records (728) erase information associated with the stopped erase operation, as further explained above with reference to FIG. 5. In some embodiments, the erase information includes a respective memory portion health metric in accordance with one or more erase difficulty metrics for the stopped erase operation and in accordance with the total number of erase operations performed on the respective non-volatile memory portion during a lifespan of the non-volatile memory device. In some embodiments, the one or more erase difficulty metrics correspond to the number of erase phases required to satisfy the erase operation stop condition, the erase voltage used during the last erase phase, the difference between the erase voltage used during the last erase phase and the erase voltage used during the first erase phase, the number of non-erased memory cells after the first erase phase, the number of erase pulses used during one or more of the erase phases, and/or the total time required to satisfy the erase operation stop condition.

Additional aspects of such erase information is further explained above with reference to FIG. 5.

FIGS. 8A-8D illustrate a flowchart representation of a method of erasing memory on a storage device using multiple erase phases, in accordance with some embodiments. With reference to the data storage system 100 pictured in FIG. 1A, in some embodiments, a method 800 is performed by a storage device (e.g., storage device 120) or one or more components of the storage device (e.g., storage controller 124). In some embodiments, the method 800 is governed by instructions that are stored in a non-transitory computer-readable storage medium and that are executed by one or more processors of a device, such as the one or more processing units (CPUs) 122-1 of management module 121-1. In some embodiments, some of the operations of method 800 are performed at a host system (e.g., computer system 110) that is operatively coupled with the storage device and other operations of method 800 are performed at the storage device. In some embodiments, method 800 is governed, at least in part, by instructions that are stored in a non-transitory computer-readable storage medium and that are executed by one or more processors of the host system (the one or more processors of the host system are not shown in FIG. 1A).

For ease of explanation, the following describes method 800 as performed by the storage device (e.g., by storage controller 124 of storage device 120, FIG. 1A, or a component thereof).

Figure 8A:
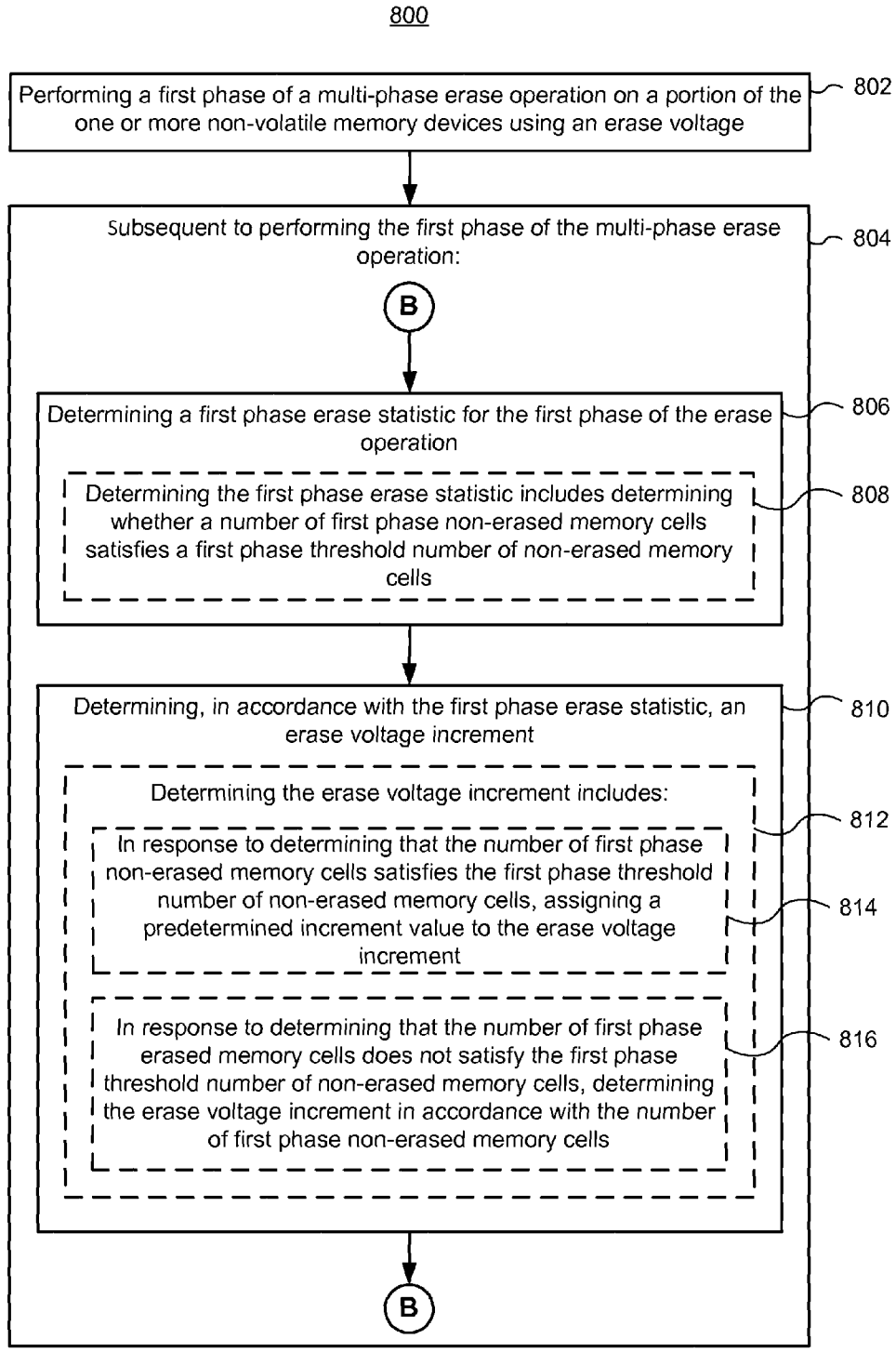
FIGS. 8A-8D illustrate a flowchart representation of a method of erasing memory on a storage device using multiple erase phases, in accordance with some embodiments.
Figure 8B:
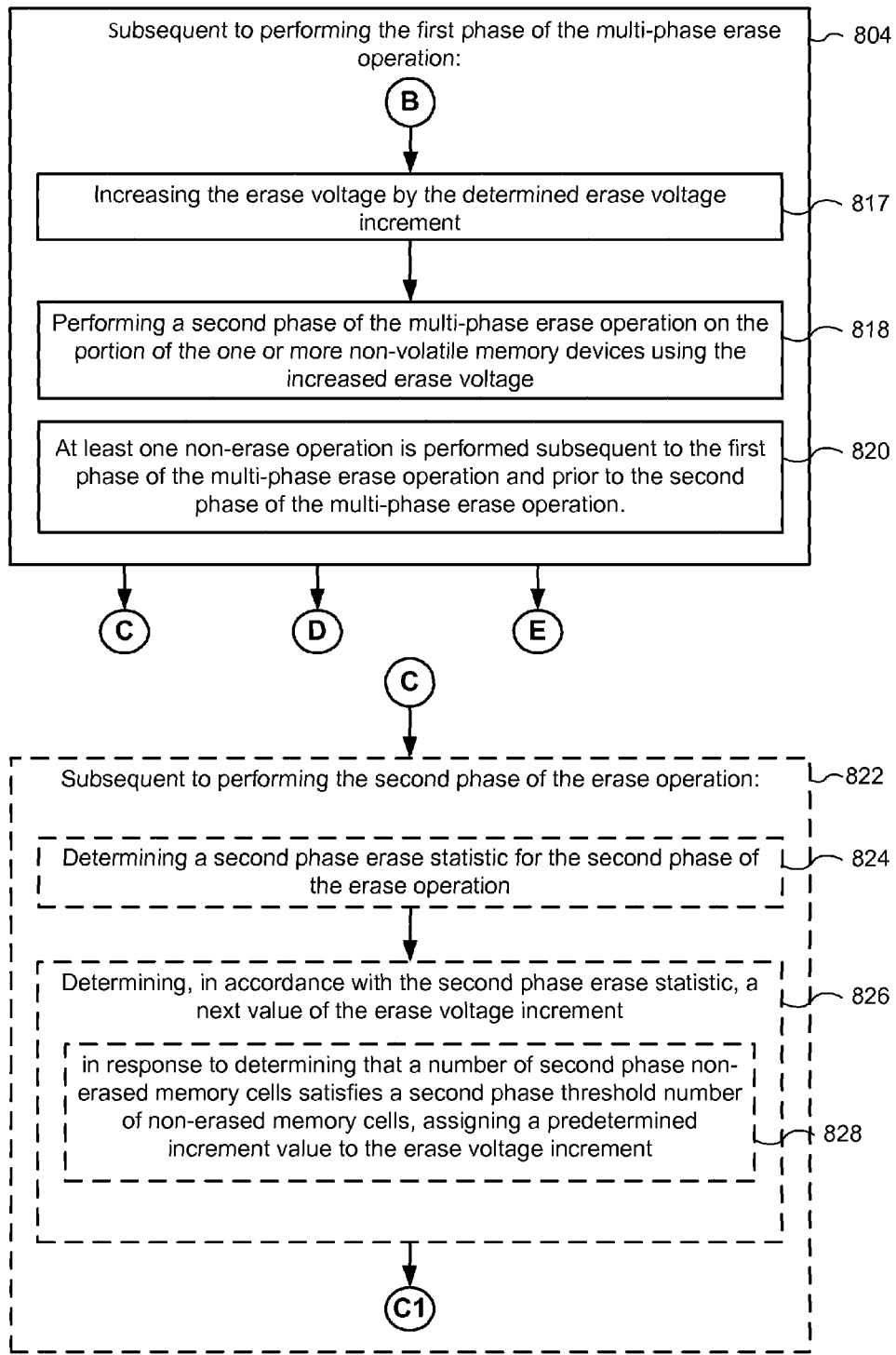
Figure 8C:
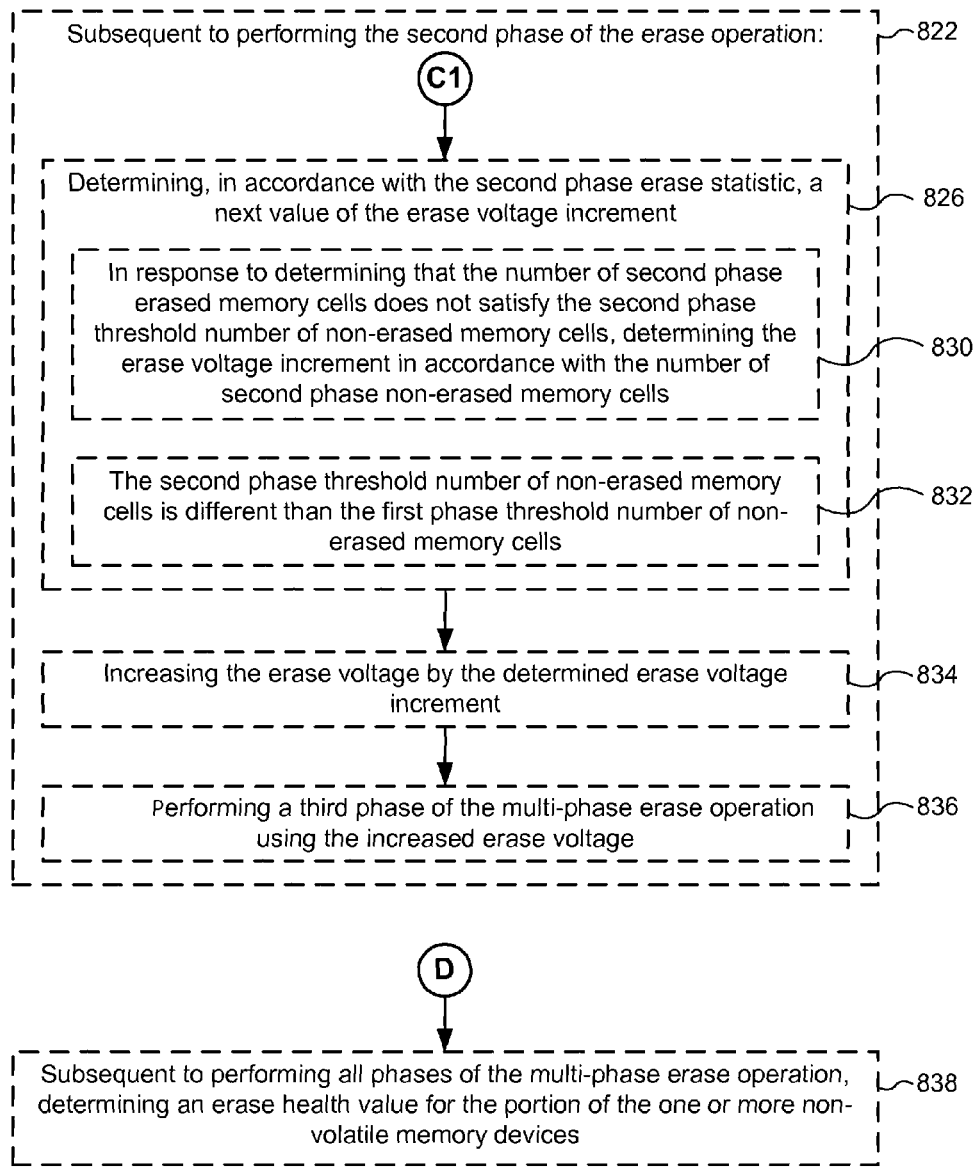
Figure 8D:
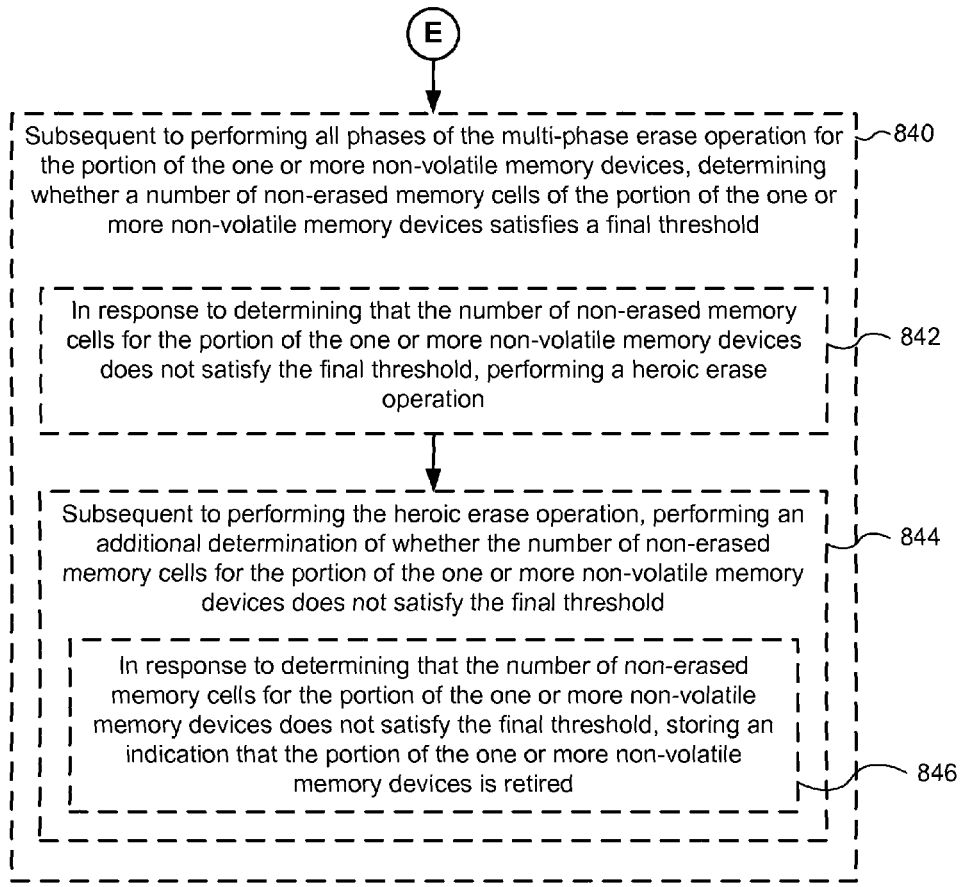

With reference to FIG. 8A, the storage device (e.g., storage device 120, FIG. 1A, or a component thereof such as erase module 218, FIG. 2) performs (802) a first phase of a multi-phase erase operation on a portion of one or more non-volatile memory devices using an erase voltage, as further explained above with reference to operation 504 of method 500.

Subsequent to performing the first phase of the multi-phase erase operation (804), the storage device (e.g., storage device 120, FIG. 1A, or a component thereof such as erase statistic module 222, FIG. 2) determines (806) a first phase erase statistic for the first phase of the erase operation. In some embodiments, determining the first phase erase statistic includes determining whether a number of first phase non-erased memory cells satisfies a first phase threshold number of non-erased memory cells (808). Erase statistics and erase phase thresholds are further explained above with reference to operation 506 of method 500.

Next, the storage device (e.g., storage device 120, FIG. 1A, or a component thereof such as erase voltage adjustment module 224, FIG. 2) determines (810), in accordance with the first phase erase statistic, an erase voltage increment. In some embodiments, determining the erase voltage increment includes (812), in response to determining that the number of first phase non-erased memory cells satisfies the first phase threshold number of non-erased memory cells, assigning a predetermined increment value to the erase voltage increment (814). Alternatively, in some embodiments, determining the erase voltage increment includes (812), in response to determining that the number of first phase erased memory cells does not satisfy the first phase threshold number of non-erased memory cells, determining (816) the erase voltage increment in accordance with the number of first phase non-erased memory cells (i.e., the number of non-erased memory cells after the first erase phase). Determining the erase voltage increment is further explained above with reference to operation 516 of method 500.

Next, the storage device (e.g., storage device 120, FIG. 1A, or a component thereof such as erase voltage adjustment module 224, FIG. 2) increases (817) the erase voltage by the determined erase voltage increment. Increasing the erase voltage means that the magnitude of the erase voltage is increased. As such, the magnitude of the erase voltage increment varies in accordance with the first phase erase statistic (e.g., a greater number of first phase non-erased memory cells leads to a larger erase voltage increment). Magnitudes of erase voltages are further explained above with reference to FIG. 5.

Next, the storage device (e.g., storage device 120, FIG. 1A, or a component thereof such as erase module 218, FIG. 2) performs (818) a second phase of the multi-phase erase operation on the portion of the one or more non-volatile memory devices using the increased erase voltage, as further explained above with reference to operation 518 of method 500.

Furthermore, the storage device (e.g., storage device 120, FIG. 1A, or a component thereof such as read module 212 or write module 214) performs at least one non-erase operation subsequent to the first phase of the multi-phase erase operation and prior to the second phase of the multi-phase erase operation (820), as further explained above with reference to operation 514 of method 500. For example, in some implementations, the at least one non-erase operation is performed after operation 806 and before operation 818.

In some embodiments, subsequent to performing the second erase phase of the erase operation (822), the storage device (e.g., storage device 120, FIG. 1A, or a component thereof such as erase statistic module 222, FIG. 2) determines (824) a second phase erase statistic for the second phase of the erase operation, as further explained above with reference to operation 506 of method 500.

Next, the storage device (e.g., storage device 120, FIG. 1A, or a component thereof such as erase voltage adjustment module 224, FIG. 2) determines (826), in accordance with the second phase erase statistic, a next value of the erase voltage increment. In some embodiments, determining the next value of the erase voltage increment includes, in response to determining that a number of second phase non-erased memory cells satisfies a second phase threshold number of non-erased memory cells, assigning a predetermined increment value to the erase voltage increment (828). Alternatively, in some embodiments, in response to determining that the number of second phase erased memory cells does not satisfy the second phase threshold number of non-erased memory cells, the storage device determines (830) the erase voltage increment in accordance with the number of second phase non-erased memory cells (i.e., the number of non-erased memory cells after the second erase phase). Optionally (but typically), the second phase threshold number of non-erased memory cells is different than the first phase threshold number of non-erased memory cells (832). Determining the erase voltage increment is further explained above with reference to operation 516 of method 500.

Next, the storage device (e.g., storage device 120, FIG. 1A, or a component thereof such as erase voltage adjustment module 224, FIG. 2) increases (834) the erase voltage by the determined erase voltage increment, as further explained above with reference to operation 516 of method 500.

Next, the storage device (e.g., storage device 120, FIG. 1A, or a component thereof such as erase module 218, FIG. 2) performs (836) a third phase of the multi-phase erase operation using the increased erase voltage. The method will continue to perform additional phases until the erase stop condition is satisfied or a maximum number of erase phases are performed, whichever occurs first. Furthermore, in some embodiments, if any high-priority non-erase operations are pending (or, alternatively, if any non-erase operations are pending) at the conclusion of a non-final phase of the multi-phase erase operation, the storage device performs at least one non-erase operation subsequent to that non-final phase of the multi-phase erase operation and prior to performing a next phase of the multi-phase erase operation.

In some embodiments, subsequent to performing all phases (e.g., the erase stop condition is satisfied or a maximum number of erase phases are performed) of the multi-phase erase operation, the storage device (e.g., storage device 120, FIG. 1A, or a component thereof such as erase module 218, FIG. 2) determines (838) an erase health value for the portion of the one or more non-volatile memory devices, as further explained above with reference to operation 512 of method 500.

In some embodiments, subsequent to performing all phases of the multi-phase erase operation for the portion of the one or more non-volatile memory devices, the storage device (e.g., storage device 120, FIG. 1A, or a component thereof such as erase module 218, FIG. 2) determines (840) whether a number of non-erased memory cells of the portion of the one or more non-volatile memory devices satisfies a final threshold. Additionally, in some embodiments, in response to determining that the number of non-erased memory cells for the portion of the one or more non-volatile memory devices does not satisfy the final threshold, the storage device performs (842) a heroic erase operation, as further explained above with reference to FIG. 5.

In some embodiments, subsequent to performing the heroic erase operation, the storage device performs (844) an additional determination of whether the number of erased memory cells for the portion of the one or more non-volatile memory devices does not satisfy the final threshold. In response to determining that the number of erased memory cells for the portion of the one or more non-volatile memory devices does not satisfy the final threshold, the storage device stores (846) an indication that the portion of the one or more non-volatile memory devices is retired, as further explained above with reference to FIG. 5.

In some embodiments, the portion of the one or more non-volatile memory devices is an erase block. In some embodiments, the one or more non-volatile memory devices are flash memory devices.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of erasing data in a storage device, the storage device having one or more non-volatile memory devices, the method comprising:
   performing an erase operation on a portion of the one or more non-volatile memory devices, by performing a sequence of erase phase operations until an erase operation stop condition is satisfied, each erase phase operation including:
      performing an erase phase on the portion of the one or more non-volatile memory devices using an erase voltage; and
      determining an erase phase statistic for the erase phase;
   wherein, for each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment, the erase voltage increment having a variable magnitude that is determined based on the erase phase statistic for the prior erase phase operation.

2. The method of claim 1, further comprising performing at least one non-erase operation between successive erase phase operations of the erase operation.

3. The method of claim 1, wherein the sequence of erase phase operations includes a first erase phase operation and a last erase phase operation, and the erase voltage used while performing the first erase phase operation is smaller in magnitude than the erase voltage used while performing the last erase phase operation.

4. The method of claim 1, wherein the erase phase statistic for the erase phase corresponds to a count of memory cells in the portion of the one or more non-volatile memory devices having a threshold voltage that satisfies a criterion corresponding to the erase phase.

5. The method of claim 1, wherein the erase phase statistic for the erase phase corresponds to a measurement of success in erasing the portion of the one or more non-volatile memory devices.

6. The method of claim 1, further comprising:
in response to a determination that the erase phase statistic satisfies the erase operation stop condition:
stopping the erase operation, and
recording erase information associated with the stopped erase operation.

7. The method of claim 6, wherein the erase information includes a respective memory portion health metric in accordance with an erase difficulty metric for the stopped erase operation and information corresponding to a total number of erase operations performed on the portion of the one or more non-volatile memory devices during a lifespan of the storage device.

8. The method of claim 1, wherein the sequence of erase phase operations includes a last allowable erase phase, and the method further comprises:
in response to a determination that the last allowable erase phase fails to satisfy the erase operation stop condition, storing an indication that the portion of the one or more non-volatile memory devices is retired.

9. The method of claim 8, wherein the last allowable erase phase is a heroic erase phase.

10. The method of claim 1, wherein the sequence of erase phase operations is limited to a threshold number of erase phases such that the erase operation is stopped when the threshold number of erase phases are performed on the portion of the one or more non-volatile memory devices.

11. A method of erasing data in a storage device, the storage device having one or more non-volatile memory devices, the method comprising:
performing a first phase of a multi-phase erase operation on a portion of the one or more non-volatile memory devices using an erase voltage; and
subsequent to performing the first phase of the multi-phase erase operation:
determining a first phase erase statistic for the first phase of the erase operation;
determining an erase voltage increment having a variable magnitude that is determined based on the first phase erase statistic for the first phase of the multi-phase erase operation;
increasing the erase voltage by the determined erase voltage increment; and
performing a second erase phase of the multi-phase erase operation on the portion of the one or more non-volatile memory devices using the increased erase voltage,
wherein at least one non-erase operation is performed subsequent to the first phase of the multi-phase erase operation and prior to the second phase of the multi-phase erase operation.

12. The method of claim 11, wherein determining the first phase erase statistic includes determining whether a number of first phase non-erased memory cells satisfies a first phase threshold number of non-erased memory cells; and
wherein determining the erase voltage increment includes:
in response to determining that the number of first phase non-erased memory cells satisfies the first phase threshold number of non-erased memory cells, assigning a predetermined increment value to the erase voltage increment; and
in response to determining that the number of first phase erased memory cells does not satisfy the first phase threshold number of non-erased memory cells, determining the erase voltage increment in accordance with the number of first phase non-erased memory cells.

13. The method of claim 11, further comprising: subsequent to performing the second phase of the erase operation, determining a second phase erase statistic for the second phase of the erase operation; determining, in accordance with the second phase erase statistic, a next value of the erase voltage increment; increasing the erase voltage by the determined erase voltage increment; and performing a third erase phase of the multi-phase erase operation using the increased erase voltage.

14. The method of claim 13, wherein determining the next value of erase voltage increment includes:
in response to determining that a number of second phase non-erased memory cells satisfies a second phase threshold number of non-erased memory cells, assigning the predetermined increment value to the erase voltage increment; and
in response to determining that the number of second phase erased memory cells does not satisfy the second phase threshold number of non-erased memory cells, determining the erase voltage increment in accordance with the number of second phase non-erased memory cells;
wherein the second phase threshold number of non-erased memory cells is different than the first phase threshold number of non-erased memory cells.

15. The method of claim 11, further comprising, subsequent to performing all phases of the multi-phase erase operation for the portion of the one or more non-volatile memory devices, determining whether a number of non-erased memory cells of the portion of the one or more non-volatile memory devices satisfies a final threshold.

16. The method of claim 15, further comprising, in response to determining that the number of non-erased memory cells for the portion of the one or more non-volatile memory devices does not satisfy the final threshold, performing a heroic erase operation.

17. The method of claim 16, further comprising:
subsequent to performing the heroic erase operation, performing an additional determination of whether the number of non-erased memory cells for the portion of the one or more non-volatile memory devices does not satisfy the final threshold; and
in response to determining that the number of non-erased memory cells for the portion of the one or more non-volatile memory devices does not satisfy the final threshold, storing an indication that the portion of the one or more non-volatile memory devices is retired.

18. The method of claim 10, further comprising, subsequent to performing all phases of the multi-phase erase operation, determining an erase health value for the portion of the one or more non-volatile memory devices.

19. The method of claim 10, wherein the portion of the one or more non-volatile memory devices is a block of flash memory.

20. A storage system, comprising;
a storage medium;

one or more processors; and memory storing one or more programs, which when executed by the one or more processors cause the storage system to:

perform an erase operation on a portion of the one or more non-volatile memory devices, by performing a sequence of erase phase operations until an erase operation stop condition is satisfied, each erase phase operation including:

performing an erase phase on the portion of the one or more non-volatile memory devices using an erase voltage; and determining an erase phase statistic for the erase phase;

wherein, for each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment, the erase voltage increment having a variable magnitude that is determined based on the erase phase statistic for the prior erase phase operation.

21. A non-transitory computer readable storage medium, storing one or more programs configured for execution by one or more processors of a storage system, the one or more programs including instructions, which when executed by the one or more processors cause the storage system to:

perform an erase operation on a portion of the one or more non-volatile memory devices, by performing a sequence of erase phase operations until an erase operation stop condition is satisfied, each erase phase operation including:

performing an erase phase on the portion of the one or more non-volatile memory devices using an erase voltage; and determining an erase phase statistic for the erase phase;

wherein, for each erase phase operation in the sequence of erase phase operations other than a first erase phase operation in the sequence of erase phase operations, the erase voltage used when performing the erase phase operation is equal to the erase voltage used when performing a prior erase phase operation in the sequence of erase phase operations plus an erase voltage increment, the erase voltage increment having a variable magnitude that is determined based on the erase phase statistic for the prior erase phase operation.

* * * * *